(12) United States Patent
Jang et al.

(10) Patent No.: US 12,457,699 B2
(45) Date of Patent: Oct. 28, 2025

(54) DISPLAY DEVICE

(71) Applicant: SAMSUNG DISPLAY CO., LTD., Yongin-si (KR)

(72) Inventors: Jae-Soo Jang, Suwon-si (KR); Juyeop Seong, Suwon-si (KR); Hee-Kwon Lee, Asan-si (KR); Sungyeon Cho, Hwaseong-si (KR); Seunghwa Ha, Cheongju-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 377 days.

(21) Appl. No.: 18/069,351

(22) Filed: Dec. 21, 2022

(65) Prior Publication Data

US 2023/0254987 A1    Aug. 10, 2023

(30) Foreign Application Priority Data

Feb. 10, 2022  (KR) .................. 10-2022-0017788
Aug. 30, 2022  (KR) .................. 10-2022-0109511

(51) Int. Cl.
*H05K 5/02*    (2006.01)

(52) U.S. Cl.
CPC .................. *H05K 5/0217* (2013.01)

(58) Field of Classification Search
CPC ...... H05K 5/0217; G09F 9/301; G06F 1/1652
See application file for complete search history.

(56) References Cited

U.S. PATENT DOCUMENTS

| | | | | |
|---|---|---|---|---|
| 2019/0090364 A1* | 3/2019 | Shin | ........................ | H10K 59/40 |
| 2020/0264660 A1* | 8/2020 | Song | .................... | H04M 1/0237 |
| 2020/0315036 A1* | 10/2020 | Ahn | ....................... | G06F 1/1652 |
| 2023/0350462 A1* | 11/2023 | Jung | ...................... | G06F 1/1656 |

FOREIGN PATENT DOCUMENTS

| | | | | |
|---|---|---|---|---|
| CN | 113053247 A | | 6/2021 | |
| CN | 219512777 U | * | 8/2023 | ............. G09F 9/301 |
| KR | 1020190085208 A | | 7/2019 | |
| KR | 20200006645 A | | 1/2020 | |
| KR | 20200067804 A | * | 6/2020 | ........... G06F 1/1652 |
| KR | 1020200064376 A | | 6/2020 | |
| KR | 102274481 B1 | | 7/2021 | |

* cited by examiner

*Primary Examiner* — Michael Zhang
(74) *Attorney, Agent, or Firm* — CANTOR COLBURN LLP

(57) ABSTRACT

A display device includes a display module including a first area and a second area extending from at least one side of the first area, wherein a portion of the display module is curved in the second area to have a constant curvature, a first plate disposed under the display module in the first area, a second plate disposed under the display module in the second area, extending from the first plate, and including a plurality of pattern portions defining an opening pattern having an edge of a closed curve and a plurality of segment portions disposed between the plurality of pattern portions, wherein a portion of the second plate overlapping the portion of the display module is curved to have a constant curvature, and a plurality of supporting elements disposed under the plurality of segment portions.

14 Claims, 26 Drawing Sheets

DISPLAY DEVICE

This application claims priority to Korean Patent Application No. 10-2022-0017788, filed on Feb. 10, 2022, Korean Patent Application No. 10-2022-0109511, filed on Aug. 30, 2022 and all the benefits accruing therefrom under 35 U.S.C. § 119, the contents of which in their entirety are herein incorporated by reference.

BACKGROUND

1. Field

Embodiments of the invention relates to a deformable display device.

2. Description of the Related Art

A display device is a device displaying an image. Recently, a display device capable of displaying an image in a deformable display area has been used. For example, in a foldable display device, the display area may be repeatedly folded or unfolded. For another example, a slidable display device may repeatedly increase or decrease an area of the display area through sliding.

The slidable display device may include a first area and a second area displaying an image. When the slidable display device is rolled by sliding, the second area may be accommodated in the slidable display device. When the slidable display device is unrolled by sliding, the second area may be exposed to outside of the slidable display device.

The slidable display device may have a curvature in at least a portion of the second area. In this case, at a boundary between the first area and the second area, bending due to lifting of the second area may occur. Accordingly, a defect may occur in the slidable display device.

SUMMARY

Embodiments provide a display device with reduced external light reflection.

A display device in an embodiment may include a display module including a first area and a second area extending from at least one side of the first area, wherein a portion of the display module is curved in the second area to have a constant curvature, a first plate disposed under the display module in the first area, a second plate disposed under the display module in the second area, extending from the first plate, and including a plurality of pattern portions defining an opening pattern having an edge of a closed curve and a plurality of segment portions disposed between the plurality of pattern portions, wherein a portion of the second plate overlapping the portion of the display module is curved to have a constant curvature, and a plurality of supporting elements disposed under the plurality of segment portions.

In an embodiment, the opening pattern may be spaced apart from an outer edge of the second plate.

In an embodiment, wherein the second plate may include an adjacent portion adjacent to the first plate, and a separation portion spaced apart from the first plate and adjacent to the adjacent portion. In addition, each of supporting elements disposed under the separation portion among the plurality of supporting elements may be in contact with each of the plurality of segment portions of the second plate by a first contact area.

In an embodiment, a contact area of each of supporting elements disposed under the adjacent portion among the plurality of supporting elements with each of the plurality of segment portions of the second plate may be larger than first contact area.

In an embodiment, as a distance from the first plate increases, the contact area of each of supporting elements disposed under the adjacent portion with each of the plurality of segment portions of the second plate may gradually decrease.

In an embodiment, the second plate may include an adjacent portion adjacent to the first plate, and a separation portion spaced apart from the first plate and adjacent to the adjacent portion. In addition, a distance between two supporting elements spaced apart from each other among the plurality of supporting elements disposed under the separation portion may be a first separation distance.

In an embodiment, a distance between two supporting elements spaced apart from each other among the plurality of supporting elements disposed under the adjacent portion may be smaller than the first separation distance.

In an embodiment, as a distance from the first plate increases, the distance between two supporting elements spaced apart from each other among the plurality of supporting elements disposed under the adjacent portion may gradually increase.

In an embodiment, a lower surface of the display module may directly contact each of an upper surface of the first plate and an upper surface of the second plate.

In an embodiment, an area of the lower surface of the display module may be smaller than sum of an area of the upper surface of the first plate and an area of the upper surface of the second plate.

In an embodiment, the display device may further include a supporting plate disposed under the first plate.

In an embodiment, the display device may further include a driving part electrically connected to the display module in the second area.

In an embodiment, other portion of the display module except the portion of the display module may have a substantially flat surface.

In an embodiment, the display device may further include a guide unit defining a receiving groove accommodating the first plate, the second plate, and the plurality of supporting elements overlapping the other portion of the display module.

A display device in another embodiment may include a display module including a first area and a second area adjacent to the first area, wherein a portion of the display module is curved in the second area to have a constant curvature, and a rigidity of the display module in the first area is larger than a rigidity of the display module in the second area, and a plurality of supporting elements disposed under the display module in the second area.

In an embodiment, the display module may include a display panel, a first protective layer disposed under the display panel in the first area, and having a first rigidity, and a second protective layer disposed under the display panel, and having a second rigidity lower than the first rigidity.

In an embodiment, the plurality of supporting elements may directly contact the second protective layer.

In an embodiment, the second protective layer may include an adjacent portion adjacent to the first protective layer and a separation portion spaced apart from the first protective layer and adjacent to the adjacent portion. In addition, a separation distance between two supporting elements spaced apart from each other among the plurality of supporting elements disposed under the separation portion may be a first separation distance.

In an embodiment, a distance between two supporting elements spaced apart from each other among the plurality of supporting elements disposed under the adjacent portion may be smaller than the first separation distance.

In an embodiment, a contact area of each of supporting elements disposed under the adjacent portion among the plurality of supporting elements with the display module may be larger than a contact area of each of supporting elements disposed under the separation portion among the plurality of supporting elements with the display module.

In addition, the transmittance of the overcoat layer may be set according to a content of the colorant and/or a thickness of the overcoat layer. For example, when a relatively high transmittance is required for the transmission area, a thickness of the overcoat layer overlapping the transmission area may be formed to be small.

The display device according to an embodiment may include a second plate including a plurality of pattern portions defining an opening pattern having an edge of a closed curve and a plurality of segment portions disposed between the plurality of pattern portions, and a plurality of supporting elements disposed under the segment portions. In the present invention, since the opening pattern has a closed curved edge, durability of the second plate may be increased. For example, damage to the plurality of pattern portions due to distortion of the plurality of supporting elements may be prevented.

The display device according to another embodiment may include a display module including a first area and a second area adjacent to the first area, wherein a portion of the display module is curved in the second area to have a constant curvature, and a rigidity of the display module in the first area is larger than a rigidity of the display module in the second area, and a plurality of supporting elements disposed under the display module in the second area. In the present invention, the rigidity of the display module in the second area may be relatively low, and accordingly, it is possible to prevent the display module from being damaged by distortion of the plurality of supporting elements.

In addition, as the overcoat layer overlapping the display area has a flat top surface, the reflective color band phenomenon of the display device may be improved. Furthermore, by adjusting thicknesses of each of the light emitting diodes, the reflective color band phenomenon may be further improved.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Illustrative, non-limiting embodiments will be more clearly understood from the following detailed description in conjunction with the accompanying drawings.

Figure 1:
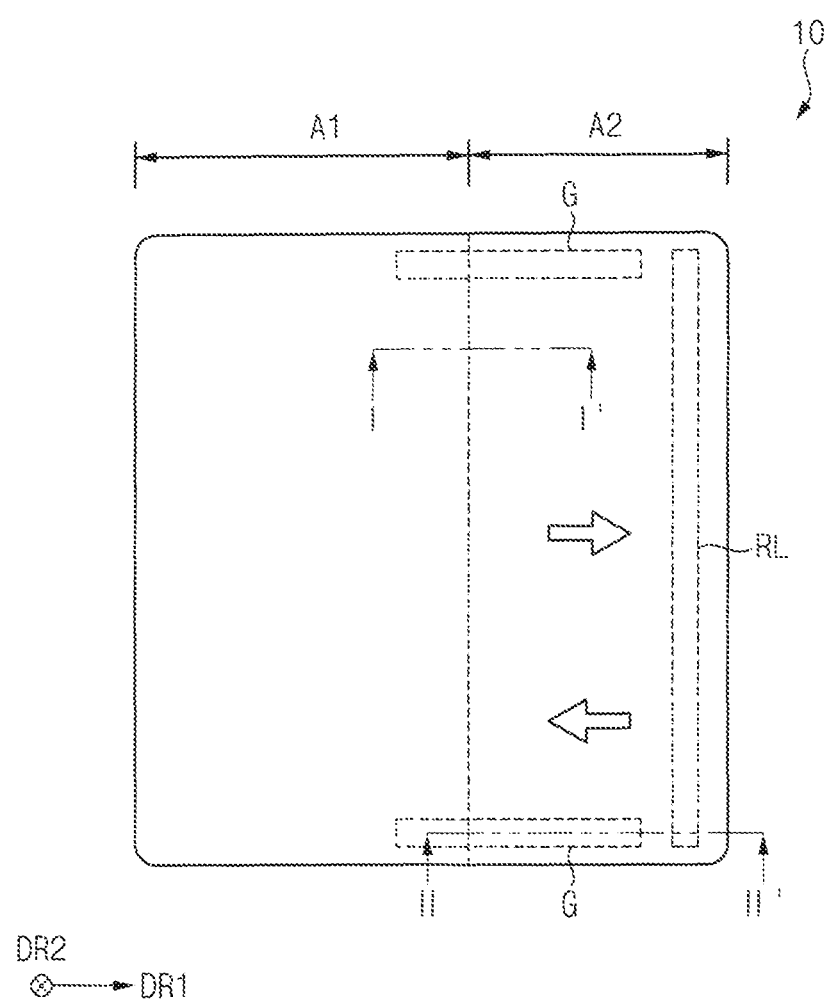
FIG. 1 is a plan view illustrating a display device according to embodiments.

FIG. 1 is a plan view illustrating a display device according to embodiments.

Referring to FIG. 1, a display device 10 may include a first area A1 and a second area A2. Each of the first area A1 and the second area A2 may be a display area displaying an image.

Figure 3:
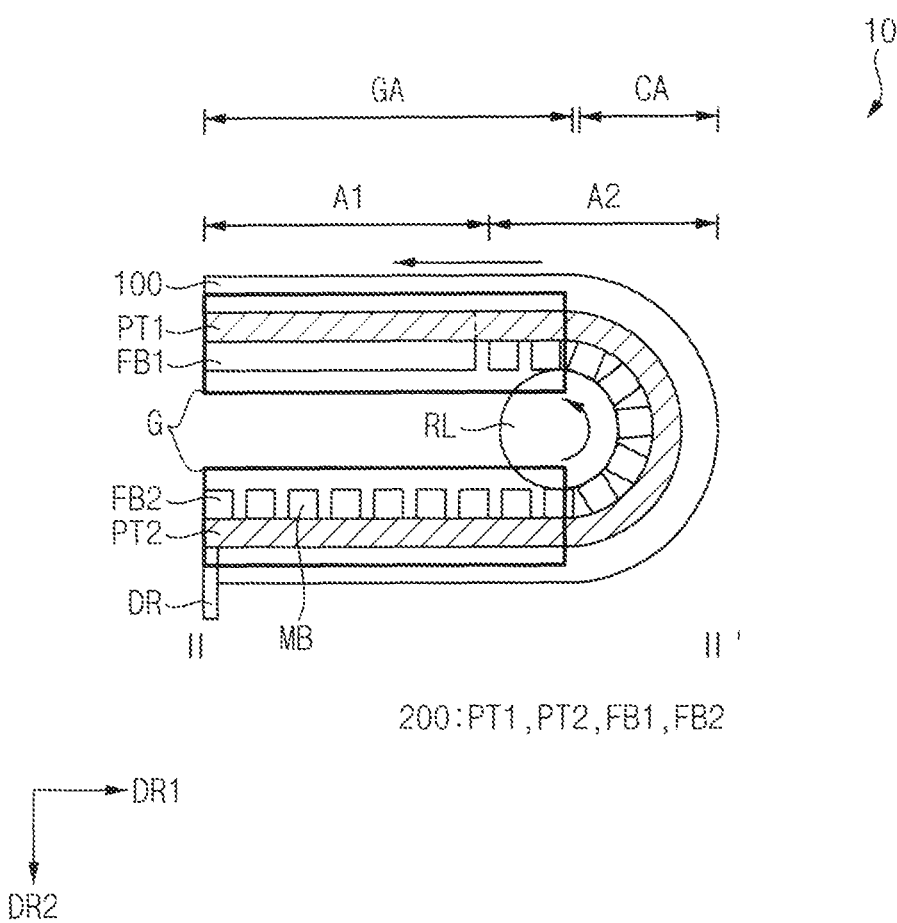
FIG. 3 and FIG. 4 are cross-sectional views taken along a line II-II' of FIG. 1.
Figure 4:
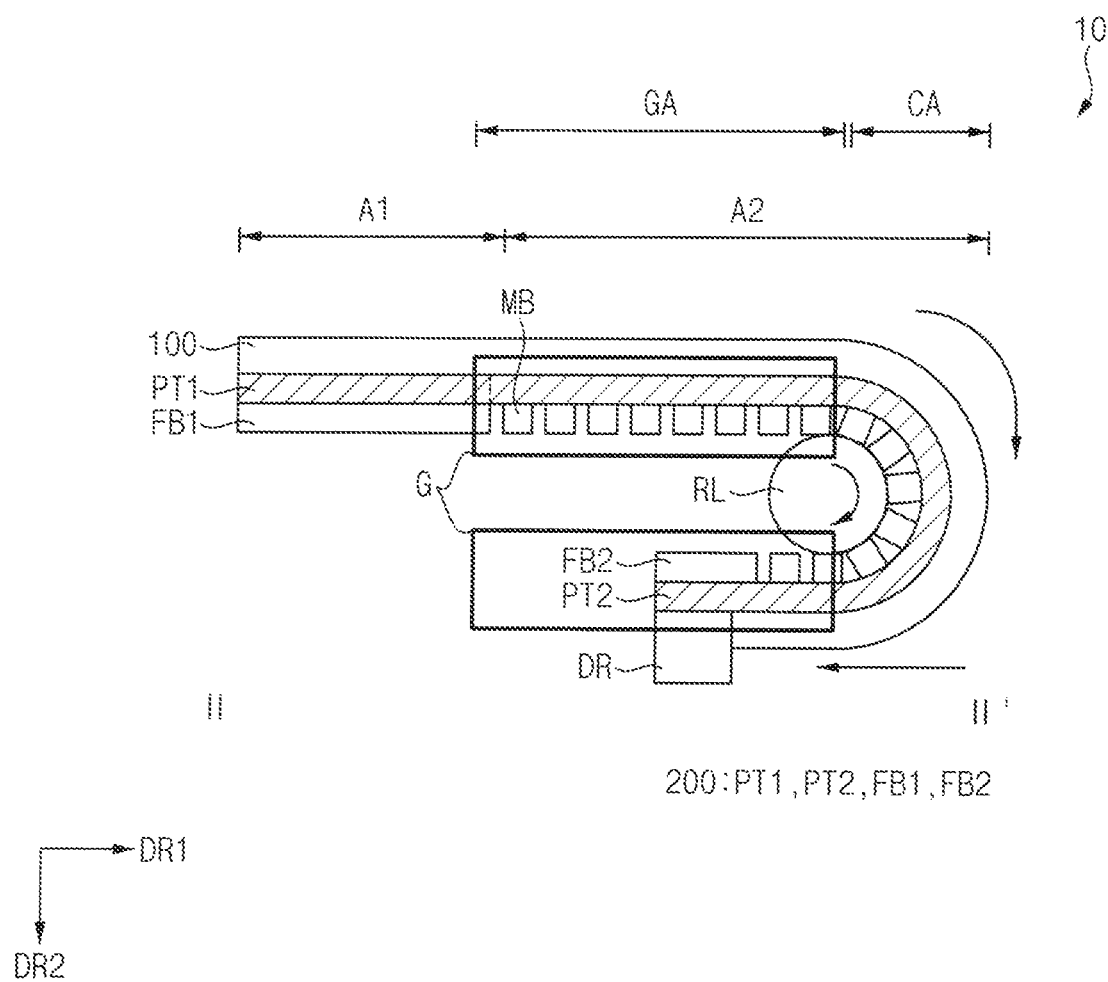

The display device 10 may be a slidable display device capable of adjusting the display area by sliding. The display area of the display device 10 may be expanded by being unrolled, and may be reduced by being rolled up. For example, as shown in FIG. 3, when the display device is rolled up by sliding, an exposed area of the second area A2 may be reduced. And, as shown in FIG. 4, when the display device is unrolled by sliding, the exposed area of the second area A2 may be expanded.

The first area A1 may be an area exposed to outside. The first area A1 may have substantially flat surface. The second area A2 may have flexibility. The second area A2 may be exposed to outside or may be accommodated in the display device 10 as the display device 10 slides. When a portion of the second area A2 is exposed to outside, the portion of the second area A2 may have substantially flat surface.

In an embodiment, the display device 10 may include a roller RL. The roller RL may rotate clockwise or counterclockwise. Accordingly, components (for example, display module 100) accommodated in the display device 10 may be exposed outside or stored inside by the rotation of the roller RL. The roller RL will be described later in detail with reference to FIG. 3 and FIG. 4.

In an embodiment, the display device 10 may include a guide unit G. The guide unit G may be disposed adjacent to the roller RL. When the components (for example, display module 100) accommodated in the display device 10 are exposed outside or stored inside, the guide unit G may guide the components adjacent to the roller RL to have a substantially flat surface. The guide unit G will be described later in detail with reference to FIG. 3, FIG. 4, and FIG. 5.

Figure 2:
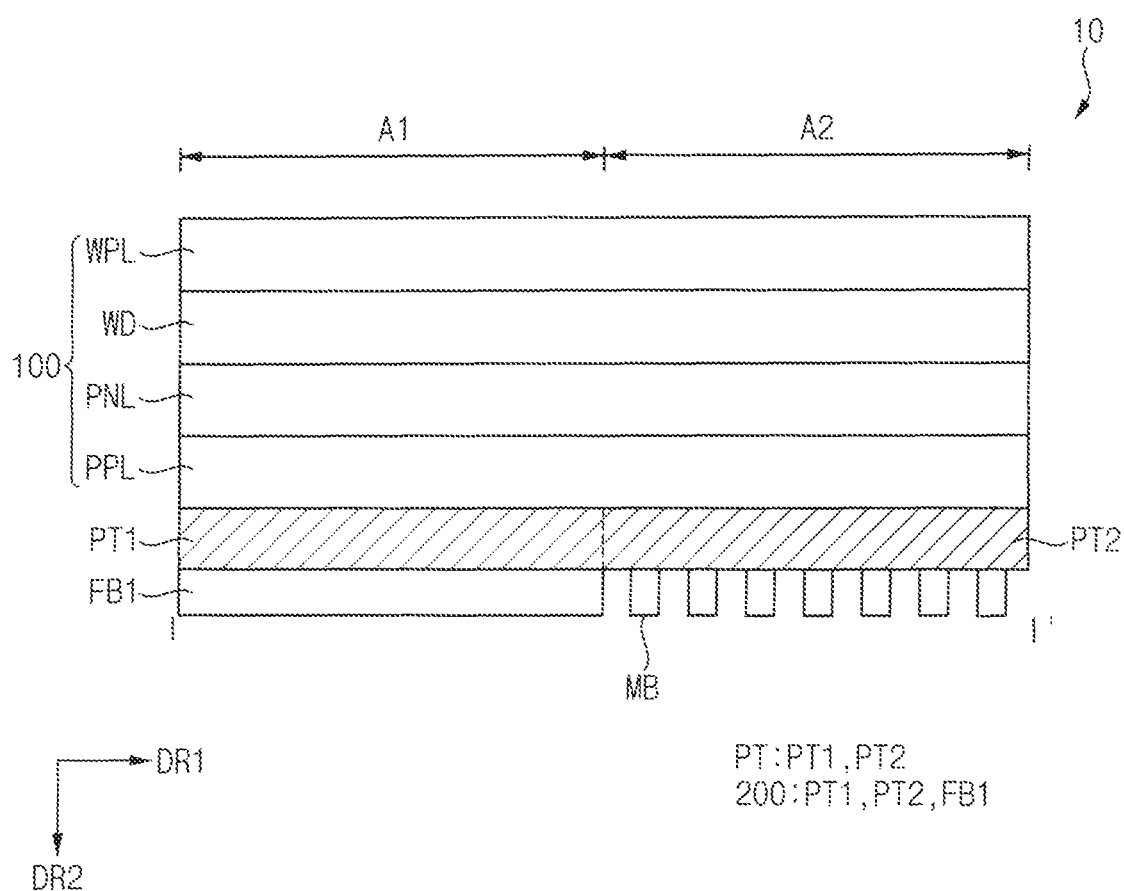
FIG. 2 is a cross-sectional view taken along a line I-I' of FIG. 1.

FIG. 2 is a cross-sectional view taken along a line I-I' of FIG. 1.

Referring to FIG. 2, the display device 10 may include a display module 100 and the lower structure 200. The display module 100 may include a panel protective layer PPL, a display panel PNL, a window WD, and a window protective layer WPL. The lower structure 200 may include a first plate PT1, a second plate PT2, a first supporting plate FB1, a plurality of supporting elements MB, and a second plate (FB2 of FIG. 3 and FIG. 4).

The display panel PNL may display an image. The display panel PNL may include a plurality of pixels emitting light.

The panel protective layer PPL may be disposed under the display panel PNL. When the display device 10 slides, tensile force or contractile force may be applied to the display panel PNL. The panel protective layer PPL may prevent the display panel PNL from being damaged by the tensile force or the contractile force.

The window WD may be disposed on the display panel PNL. The window WD may prevent the display panel PNL from being damaged by external impact.

The window protective layer WPL may be disposed on the window WD. The window protective layer WPL may prevent the window WD from being damaged by external impact.

Each of the display panel PNL, the panel protective layer PPL, the window WD, and the window protective layer WPL may have flexibility. Accordingly, each of the display panel PNL, the panel protective layer PPL, the window WD, and the window protective layer WPL may be repeatedly folded or unfolded.

The first plate PT1 may be disposed under the display module 100 in the first area A1. The first plate PT1 may have relatively large rigidity. Accordingly, the first plate PT1 may support the display module 100 in the first area A1. In an embodiment, the first plate PT1 may have substantially flat surface.

Figure 6:
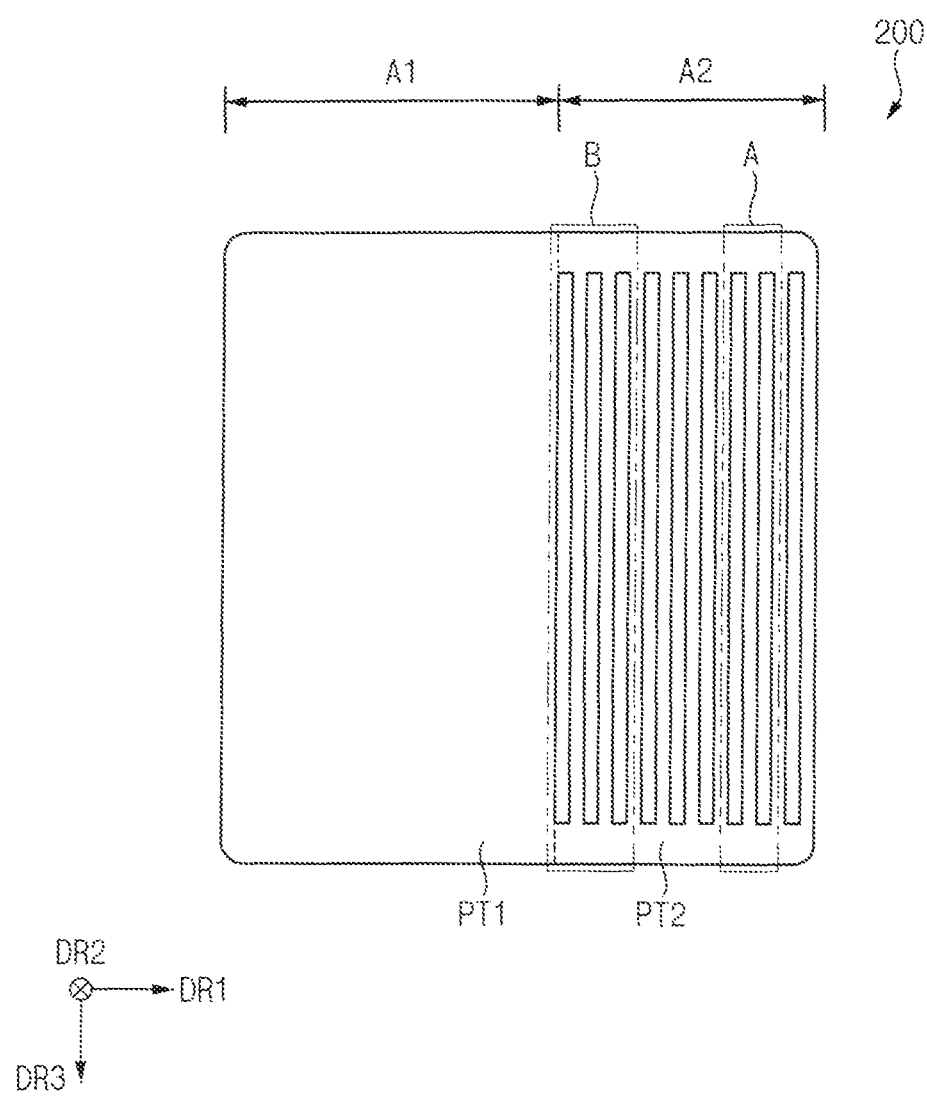
FIG. 6 is a diagram illustrating a lower structure included in the display device of FIG. 1.

The second plate PT2 may be disposed under the display module 100 in the second area A2. The second plate PT2 may extend from the first plate PT1. In an embodiment, as shown in FIG. 6, the second plate PT2 may be integrally formed with the first plate PT1. The second plate PT2 may define an opening pattern (OP of FIG. 7), and accordingly, a flexibility of the second plate PT2 may be larger than a flexibility of the first plate PT1.

In an embodiment, a lower surface of the display module 100 may directly contact an upper surface of the first plate PT1 and an upper surface of the second plate PT2. In this case, an area of the lower surface of the display module 100 may be smaller than a sum of an area of the upper surface of the first plate PT1 and an area of the upper surface of the second plate PT2.

The first supporting plate FB1 may be disposed under the first plate PT1 in the first area A1. A rigidity of the first supporting plate FB1 may be larger than a rigidity of the first plate PT1. Accordingly, the first supporting plate FB1 may support the first plate PT1 and the display module 100 in the first area A1. In an embodiment, the first supporting plate FB1 may be omitted.

The plurality of supporting elements MB may be disposed under the second plate PT2 in the second area A2. The plurality of supporting element MB will be described later with reference to FIG. 6 to FIG. 12.

Figure 5:
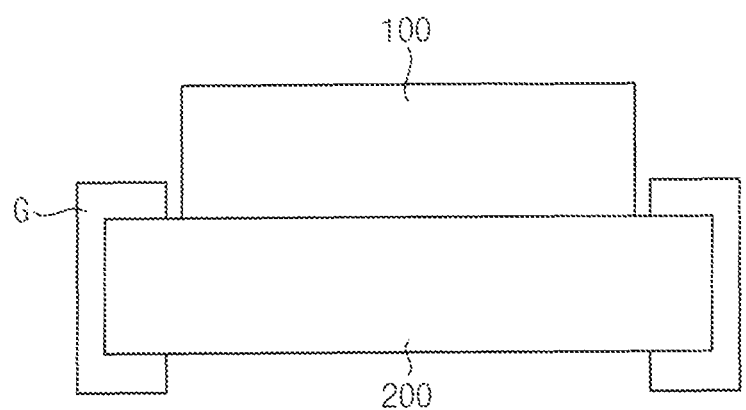
FIG. 5 is a diagram illustrating a guide unit included in the display device of FIG. 1.
Figure 5:
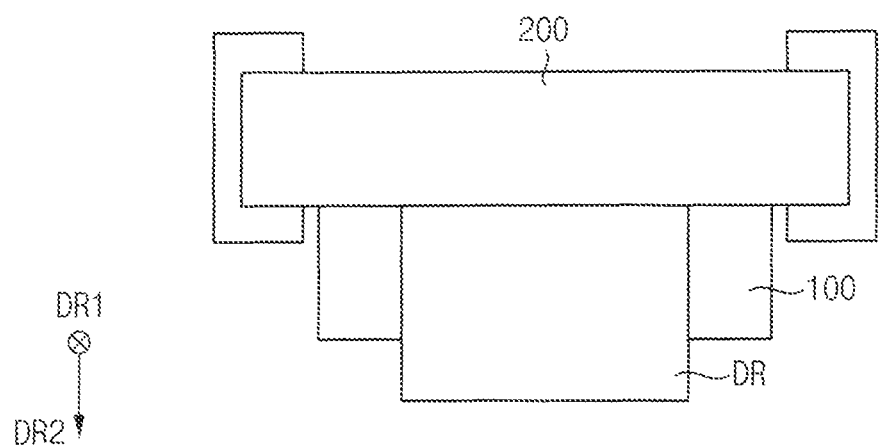

FIG. 3 and FIG. 4 are cross-sectional views taken along a line II-IF of FIG. 1. FIG. 3 is a cross-sectional view illustrating a state which the second area A2 is accommodated in the display device 10, and FIG. 4 is a cross-sectional view illustrating a state which the second area A2 is exposed to outside. FIG. 5 is a diagram illustrating a guide unit included in the display device of FIG. 1.

Referring to FIG. 3, FIG. 4, and FIG. 5, the display device DD may include a roller RL disposed in the display device DD. In an embodiment, the roller RL may rotate clockwise or counterclockwise. When the roller RL rotates counterclockwise, the second area A2 may be exposed to outside, and accordingly, the display area of the display device 10 may be expanded. When the roller RL rotates clockwise, the second area A2 may be accommodated in the display device 10, and accordingly, the display area of the display device 10 may be reduced.

In an area adjacent to the roller RL, a portion of the display device 10 may be curved to have a predetermined curvature. In this case, the area adjacent to the roller RL may be referred to as a curved area CA. In the curved area CA, a portion of the display module 100 may be curved to have a substantially constant curvature. In addition, in the curved area CA, a portion of the second plate PT2 overlapping the portion of the display module 100 may be curved to have a substantially constant curvature.

Other portion of the display module 100 except for the portion of the display module 100 may have a substantially flat surface. In this case, the display device 10 may include a guide unit G accommodating the lower structure 200 overlapping the other portion of the display module 100. The guide unit G may have a receiving groove accommodating the first plate PT1, the second plate PT2, and the plurality of supporting elements MB included in the lower structure 200. Due to the guide unit G, other portion of the display device 10 including the other portion of the display module 100 may have a substantially flat surface. In this case, an area in which the guide unit G is disposed may be referred to as a guide area GA.

In an embodiment, the guide unit G may be disposed to be spaced apart from the portion of the display module 100 which is curved to have the curvature. In other words, the curved area CA and the guide area GA may be spaced apart from each other. Accordingly, when the roller RL rotates clockwise or counterclockwise and the lower structure 200 is accommodated in the guide unit G, entanglement (or collision) between the lower structure 200 and the guide unit G may not occur.

A driving part DR and the second supporting plate FB2 may be disposed at one end of the second plate PT2 opposite to other end of the second plate PT2 adjacent to the first plate PT1.

The second supporting plate FB2 may be disposed at a same layer as the first supporting plate FB1 and the plurality of supporting elements MB. The second supporting plate FB2 may support the driving part DR. In an embodiment, the second supporting plate FB2 may be omitted.

The driving part DR may be disposed at a same layer as the display module 100. The driving part DR may be electrically connected to the display module 100. The driving part DR may provide driving signal to the plurality of pixels included in the display panel PNL. FIG. 1.

FIG. 6 is a diagram illustrating a lower structure included in the display device of FIG. 1.

Referring to FIG. 6, the second plate PT2 may include a plurality of pattern portions defining an opening pattern having an edge of a closed curve and a plurality of segment portions disposed between the plurality of pattern portions. The opening pattern, the plurality of pattern portions, and the plurality of segment portions will be described later with reference to FIG. 7 to FIG. 12.

The second plate PT2 may include an adjacent portion B adjacent to the first plate PT1 and a separation portion A spaced apart from the first plate PT1 and adjacent to the adjacent portion B.

Figure 7:
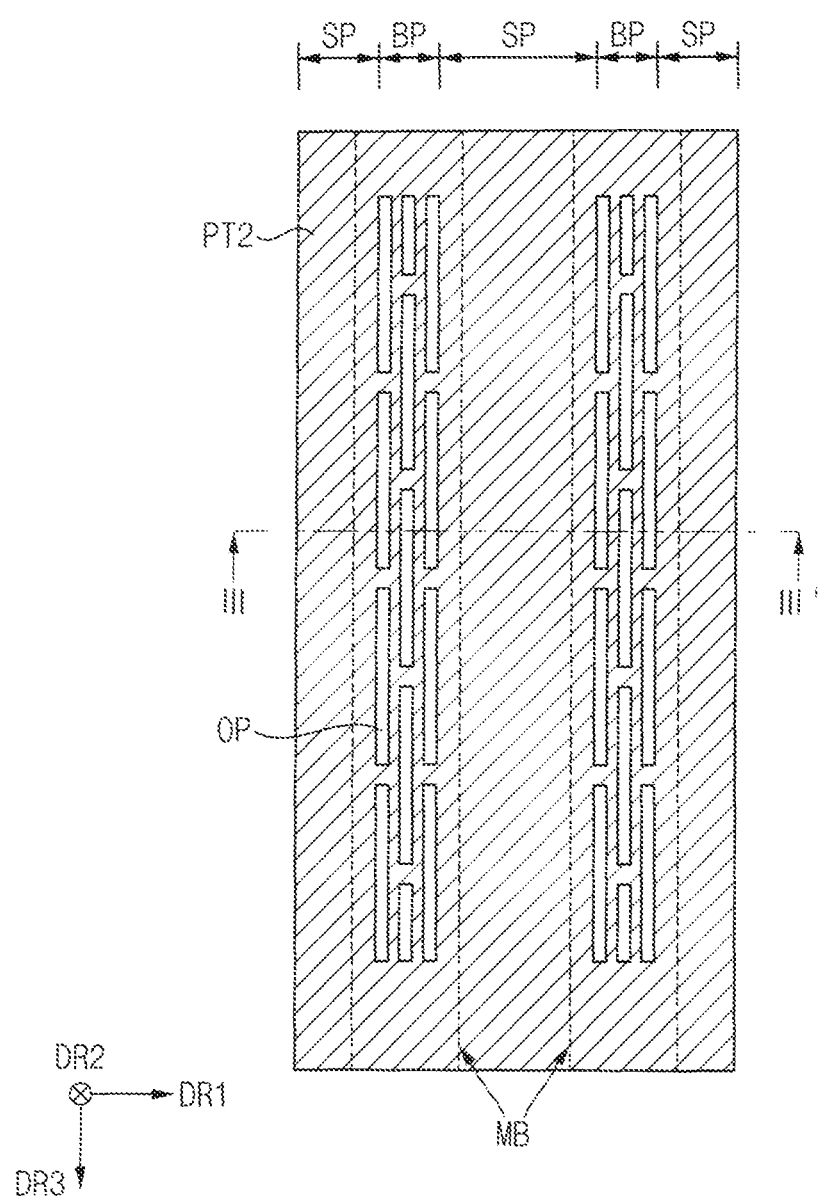
FIG. 7 is a plan view enlarging a separation portion of FIG. 6.
Figure 8:
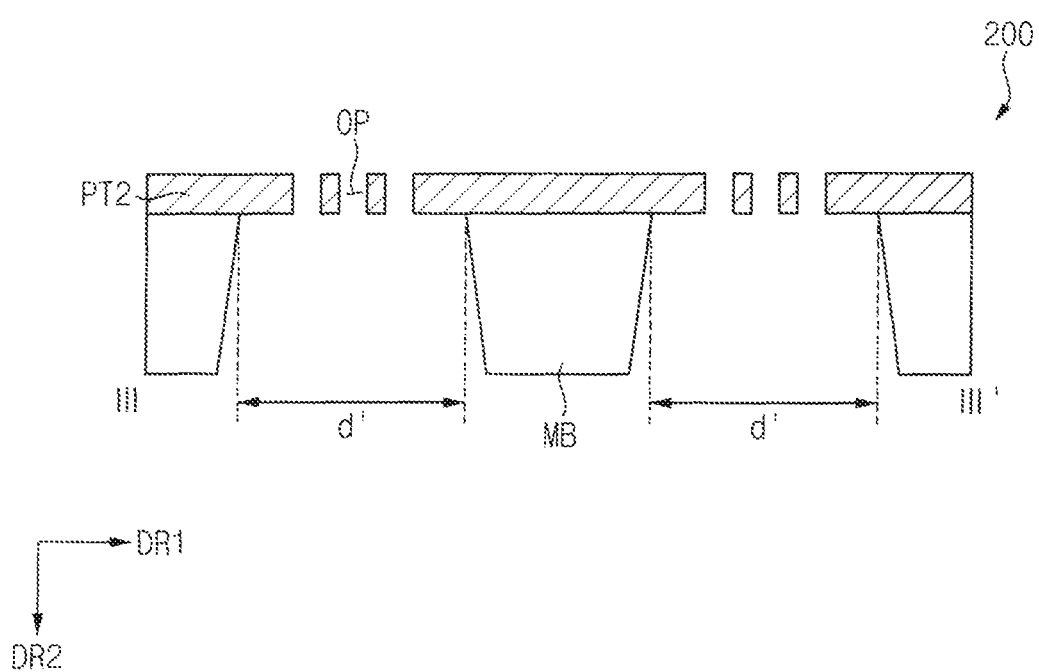
FIG. 8 is a cross-sectional view taken along a line III-III' of FIG. 7.

FIG. 7 is a plan view enlarging a separation portion of FIG. 6. FIG. 8 is a cross-sectional view taken along a line III-III' of FIG. 7.

Referring to FIG. 7 and FIG. 8, the separation portion A may include a plurality of pattern portion BP defining an opening pattern OP having an edge of a closed curve and a plurality of segment portions SP disposed between the plurality of pattern portions BP. The opening pattern OP may be spaced apart from an outer edge of the second plate PT2.

The plurality of supporting elements MB may be disposed under each of the plurality of segment portions SP. The plurality of supporting elements MB may not overlap the plurality of pattern portion BP.

In an embodiment, the plurality of supporting elements MB disposed under the separation portion A may directly contact the plurality of segment portions SP, and in this case, a contact area of each of the plurality of segment portions SP with each of the supporting elements MB may be a first contact area.

In an embodiment, a distance between two supporting elements spaced apart from each other among the plurality of supporting elements MB disposed under the separation portion A may be a first separation distance d'.

Figure 9:
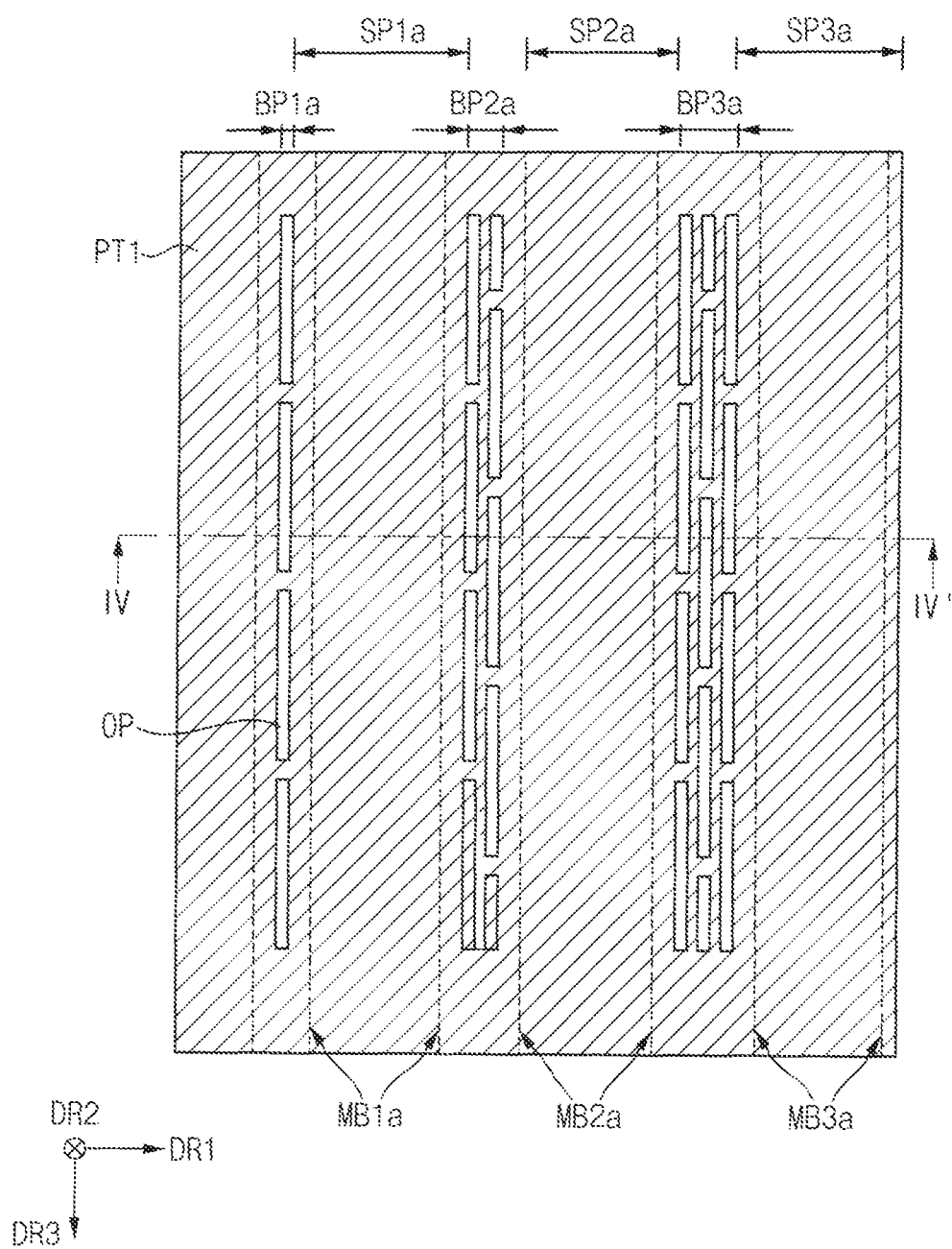
FIG. 9 is a plan view enlarging an adjacent portion of FIG. 6.
Figure 10:
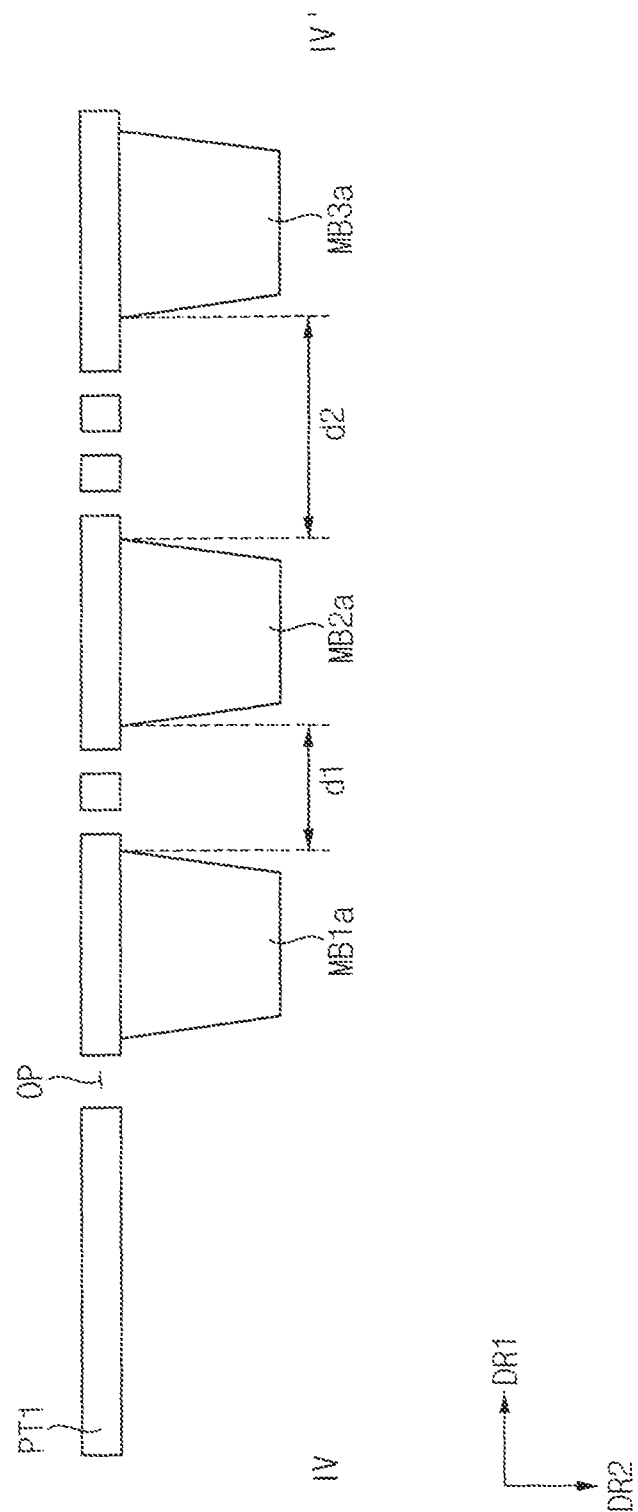
FIG. 10 is a cross-sectional view taken along a line IV-IV' of FIG. 9.

FIG. 9 is a plan view enlarging an adjacent portion of FIG. 6. FIG. 10 is a cross-sectional view taken along a line IV-IV' of FIG. 9. FIG. 9 and FIG. 10 are diagrams illustrating an adjacent portion according to an embodiment.

Referring to FIG. 9 and FIG. 10, in the adjacent portion B, the second plate PT2 may include a first pattern portion BP1*a*, a second pattern portion BP2*a*, a third pattern portion BP3*a*, a first segment portion SP1*a*, a second segment portion SP2*a*, and a third segment portion SP3*a*.

The first to third pattern portions BP1*a*, BP2*a*, and BP3*a* may be three pattern portions adjacent to the first plate PT1 among the plurality of pattern portions BP. For example, the first pattern portion BP1*a* may be a pattern portion closest to the first plate PT1, the second pattern portion BP2*a* may be a pattern portion closest to the first pattern portion BP1*a*, and the third pattern portion BP3*a* may be a pattern portion closest to the second pattern portion BP2*a*.

The first to third segment portions SP1*a*, SP2*a*, and SP3*a* may be three pattern portions adjacent to the first plate PT1 among the plurality of segment portions SP. For example, the first segment portion SP1*a* may be disposed between the first pattern portion BP1*a* and the second pattern portion BP2*a*, the second segment portion SP2*a* may be disposed between the second pattern portion BP2*a* and the third pattern portion BP3*a*, and the third segment portion SP3*a* may be disposed to adjacent to the second pattern portion BP3*a*.

First to third supporting elements MB1*a*, MB2*a*, and MB3*a* may be disposed under the first to third segment portions SP1*a*, SP2*a*, and SP3*a*. The first to third supporting elements MB1*a*, MB2*a*, and MB3*a* may be three supporting elements closest to the first plate PT1 among the plurality of supporting elements MB.

In an embodiment, each of a separation distance d1 between the first supporting element MB1*a* and the second supporting element MB2*a* and a separation distance d2 between the second supporting element MB2*a* and the third supporting element MB3*a* may be smaller than the first separation distance d'. Accordingly, when the display device 10 slides, lifting may not occur at a boundary between the first area A1 and the second area A2.

In an embodiment, as a distance from the first plate PT1 increases, a separation distance between two supporting elements spaced apart from each other among the supporting elements MB1*a*, MB2*a*, and MB3*a* disposed under the adjacent portion B may gradually increase, and may converge to the first separation distance d'. For example, the separation distance d2 between the second supporting element MB2*a* and the third supporting element MB3*a* may be larger than the separation distance d1 between the first supporting element MB1*a* and the second supporting element MB2*a*.

In FIG. 9 and FIG. 10, only three supporting elements MB1*a*, MB2*a*, and MB3*a* are illustrated for convenience of description, but the present invention is not limited thereto. For example, four supporting elements, four segment portions and for pattern portions may be disposed in the segment portion B.

Figure 11:
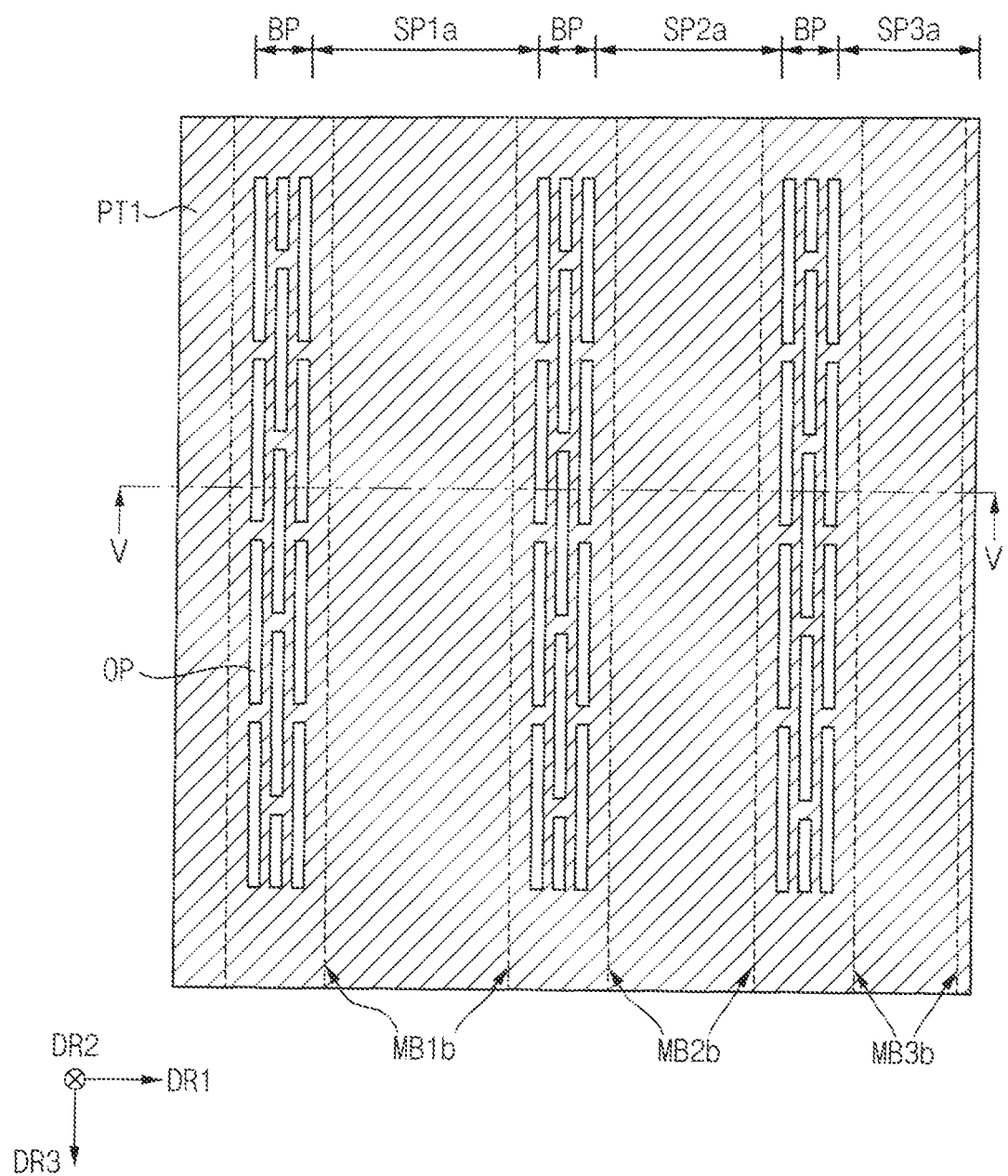
FIG. 11 is a plan view enlarging an adjacent portion of FIG. 7.
Figure 12:
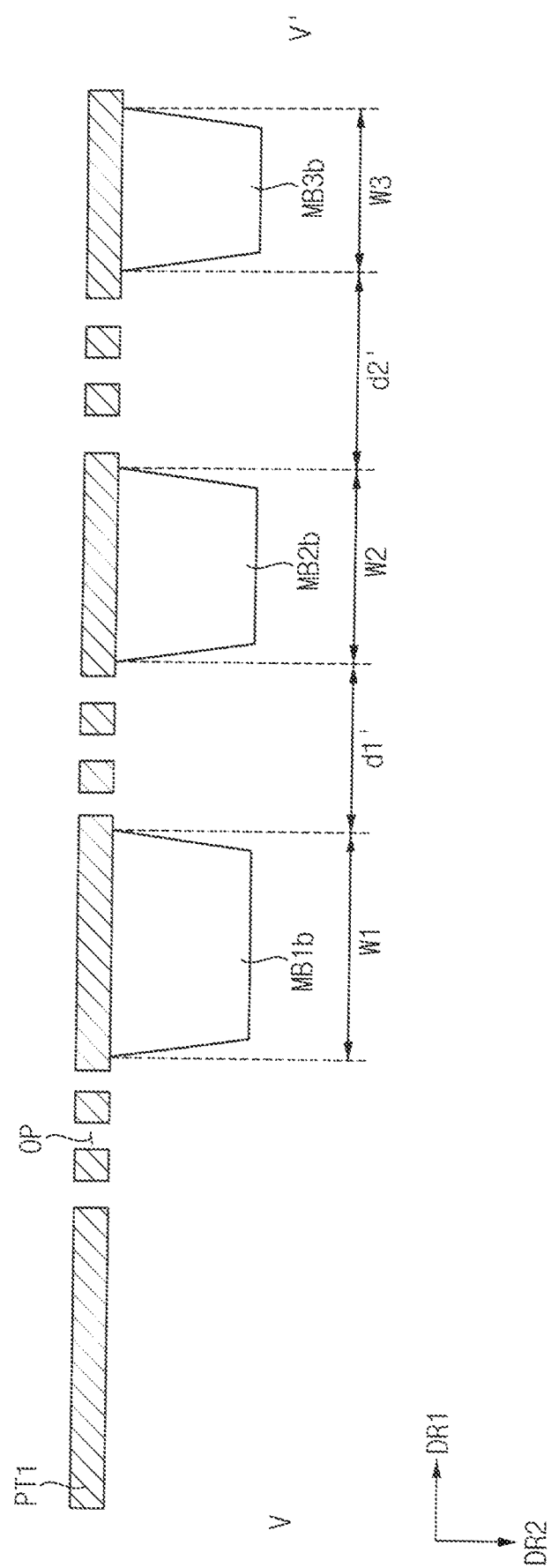
FIG. 12 is a cross-sectional view taken along a line V-V' of FIG. 11.

FIG. 11 is a plan view enlarging an adjacent portion of FIG. 7. FIG. 12 is a cross-sectional view taken along a line V-V' of FIG. 11. FIG. 11 and FIG. 12 are diagrams illustrating an adjacent portion according to another embodiment.

Referring to FIG. 11 and FIG. 12, in the adjacent portion B, the second plate PT2 may include three pattern portions BP, a first segment portion SP1*b*, a second segment portion SP2*b*, and a third segment portion SP3*b*.

The first to third segment portions SP1*b*, SP2*b*, and SP3*b* may be three segment portions adjacent to the first plate PT1 among the plurality of segment portions SP. For example, the first segment portion SP1*b* may be a segment portion closest to the first plate PT1, the second segment portion SP2*b* may be a segment portion closest to the first segment portion SP1*b*, and the third segment portion SP3*b* may be a segment portion closest to the second segment portion SP2*b*.

First to third supporting elements MB1*b*, MB2*b*, and MB3*b* may be disposed under the first to third segment portions SP1*b*, SP2*b*, and SP3*b*. The first to third supporting elements MB1*b*, MB2*b*, and MB3*b* may be three supporting elements closest to the first plate PT1 among the plurality of supporting elements MB.

In an embodiment, each of a contact area of the first supporting element MB1*b* with the first segment portion SP1*b*, a contact area of the second supporting element MB2*b* with the second segment portion SP2*b*, and a contact area of the third supporting element MB3*b* with the third segment portion SP3*b* may be larger than the first contact area. For example, in FIG. 8, a contact area of each of the plurality of supporting elements MB disposed under the separation portion A may be proportional to a width of each of the plurality of supporting elements MB disposed under the separation portion A. In this case, the width of each of the plurality of supporting elements MB disposed under the separation portion A may be a first width, and each of a width of the first supporting element MB1*b*, a width of the second supporting element MB2*b*, and a width of the third supporting element MB3*b* may be larger than the first width.

Accordingly, when the display device 10 slides, lifting may not occur at a boundary between the first area A1 and the second area A2.

In an embodiment, as the distance from the first plate PT1 increases, each of the contact area of the first supporting element MB1b with the first segment portion SP1b, the contact area of the second supporting element MB2b with the second segment portion SP2b, and the contact area of the third supporting element MB3b with the third segment portion SP3b may gradually decrease, and may converge to the first contact area. For example, the width W1 of the first supporting element MB1b may be larger than the width W2 of the second supporting element MB2b, and the width W2 of the second supporting element MB2b may be larger than the width W3 of the third supporting element MB3b.

In an embodiment, each of a separation distance d1' between the first supporting element MB1b and the second supporting element MB2b and a separation distance d2' between the second supporting element MB2b and the third supporting element MB3b may be smaller than the first separation distance d'. Accordingly, when the display device 10 slides, lifting may not occur at a boundary between the first area A1 and the second area A2.

In an embodiment, as the distance from the first plate PT1 increases, a separation distance between two supporting elements among the plurality of supporting elements MB1b, MB2b, and MB3b disposed under the adjacent portion may be gradually increase, and may converge to the first separation distance d'. For example, the separation distance d2' between the second supporting element MB2b and the third supporting element MB3b may be larger than the separation distance d3' between the first supporting element MB1b and the second supporting element MB2b.

In FIG. 11 and FIG. 12, only three supporting elements MB1b, MB2b, and MB3b are illustrated for convenience of description, but the present invention is not limited thereto. For example, four supporting elements, four segment portions and for pattern portions may be disposed in the segment portion B.

Figure 13:
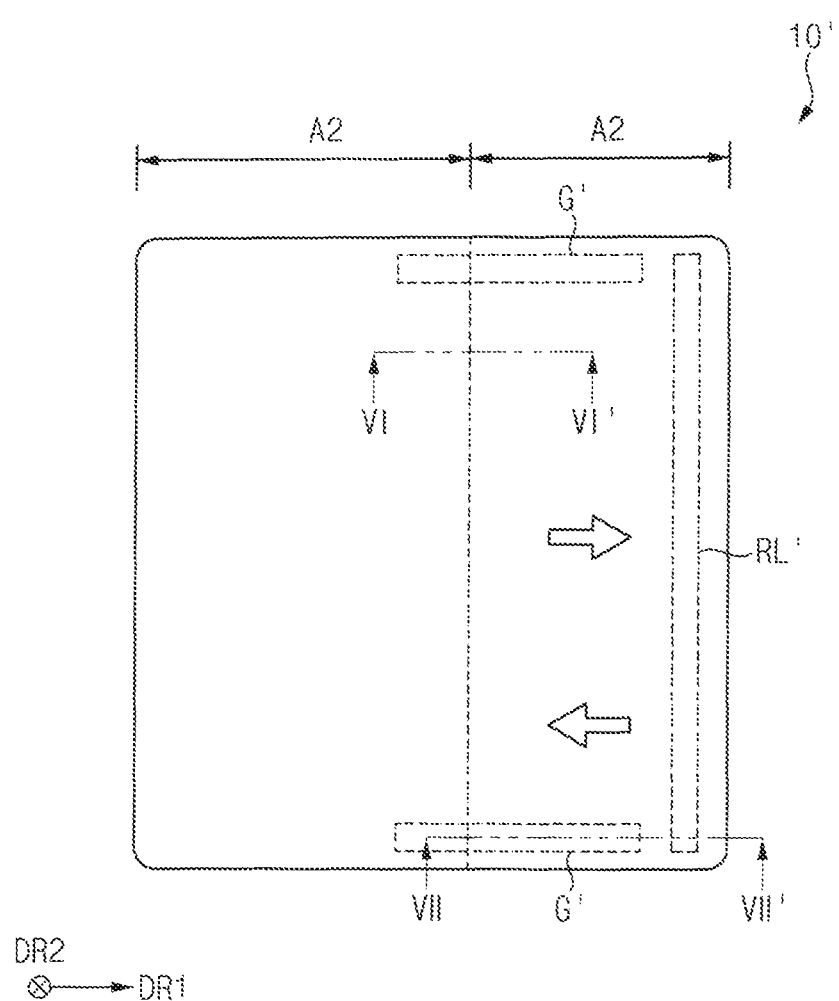
FIG. 13 is a diagram illustrating a display device according to another embodiment.

FIG. 13 is a diagram illustrating a display device according to another embodiment.

Referring to FIG. 13, a display device 10' may be substantially same as the display device 10 described with reference to FIG. 1. Specifically, the display device 10' may include a first area A1 and the second area A2. Each of the first area A1 and the second area A2 may be a display area displaying an image.

The display device 10' may be a slidable display device capable of adjusting the display area by sliding. The display area of the display device 10 may be expanded by being unrolled, and may be reduced by being rolled up.

The first area A1 may be an area exposed to outside. The first area A1 may have substantially flat surface. The second area A2 may have flexibility. The second area A2 may be exposed to outside or may be accommodated in the display device 10' as the display device 10' slides. When the second area A2 is exposed to outside, a portion of the second area A2 exposed to outside may have substantially flat surface.

Figure 14:
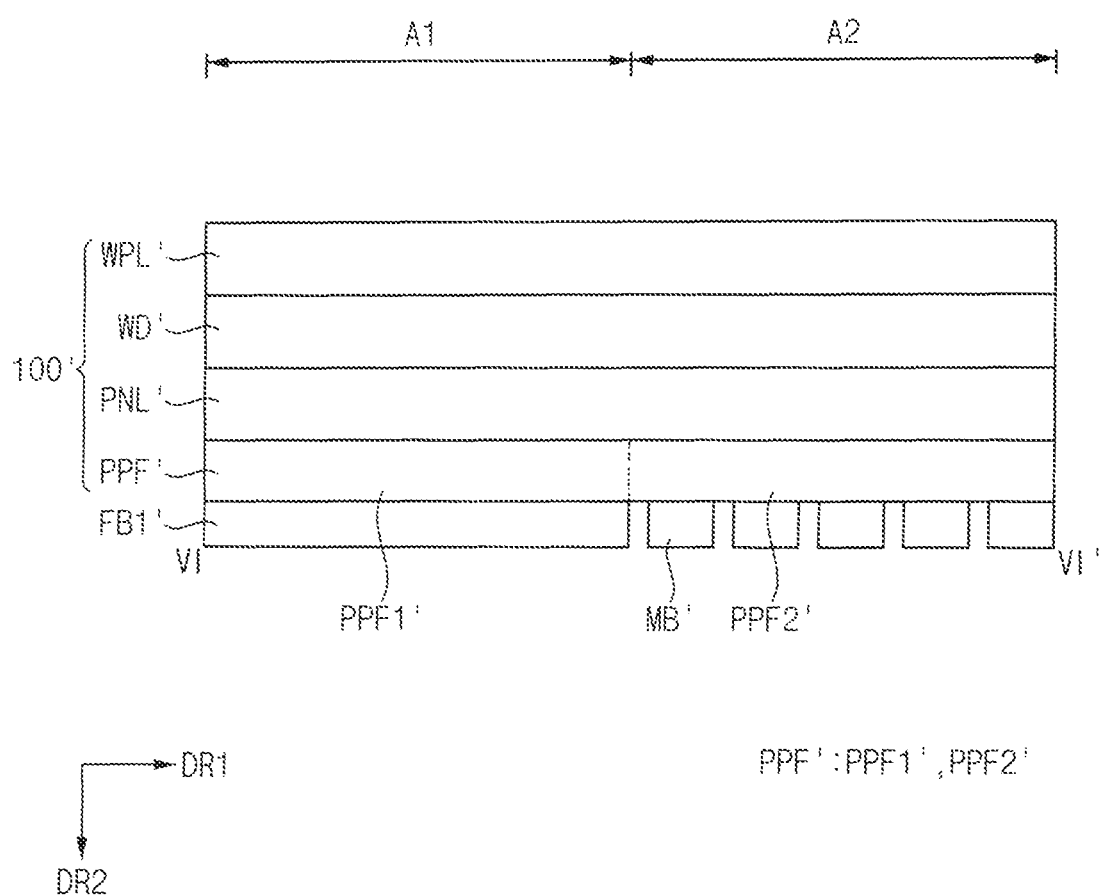
FIG. 14 is a cross-sectional view taken along a lien VI-VI' of FIG. 13.

FIG. 14 is a cross-sectional view taken along a lien VI-VI' of FIG. 13.

Referring to FIG. 14, the display device 10' may include a display module 100', a first supporting plate FB1', and a plurality of supporting elements MB'. The display module 100' may include a panel protective layer PPF', a display panel PNL', a window WD', and a window protective layer WPL'.

The display panel PNL', the window WD', and the window protective layer WPL' may be substantially same as the display panel PNL, the window WD, and the window protective layer WPL described with reference to FIG. 2.

The panel protective layer PPF' may be disposed under the display panel PNL'. The panel protective layer PPF' may include a first protective layer PPF1' disposed under the display panel PNL' in the first area A1 and a second protective layer PPF2' disposed under the display panel PNL' in the second area A2.

In an embodiment, a rigidity of the first protective layer PPF1' may be larger than a rigidity of the second protective layer PPF2'. In this case, the second protective layer PPF2' may have a relatively more flexibility than the first protective layer PPF1'.

In the second protective layer PPF2', a portion adjacent to the first protective layer PPF1' may be referred to as an adjacent portion. In the second protective layer PPF2', a portion spaced apart from the first protective layer PPF1', and adjacent to the adjacent portion may be referred to as a separation portion.

The first supporting plate FB1' may be disposed under the first protective layer PPF1' in the first area A1. The first supporting plate FB1' may have relatively large rigidity. Accordingly, the first supporting plate FB1' may support the display module 100 in the first area A1. In an embodiment, when the rigidity of the first protective layer PPF1' is substantially large, the first supporting plate FB1' may be omitted.

The plurality of supporting elements MB' may be disposed under the second protective layer PPF2' in the second area A2. The plurality of supporting elements MB' may directly contact the second protective layer PPF2'.

Figure 15:
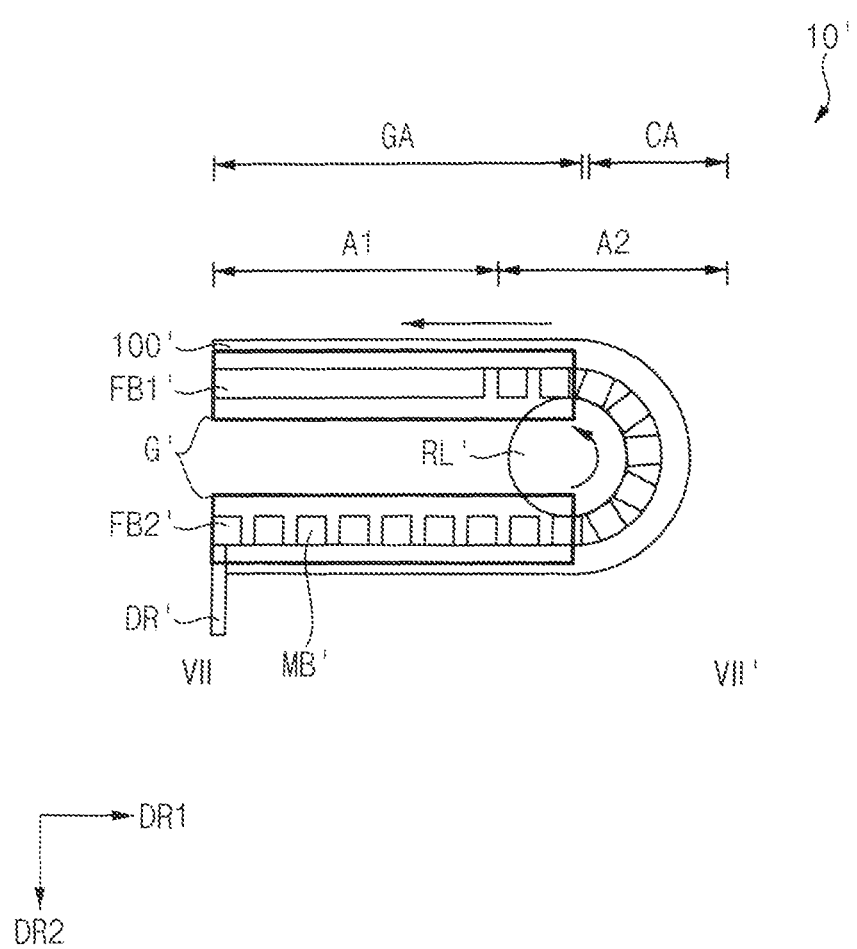
FIG. 15 and FIG. 16 are cross-sectional views taken along a line VII-VII' of FIG. 13.
Figure 16:
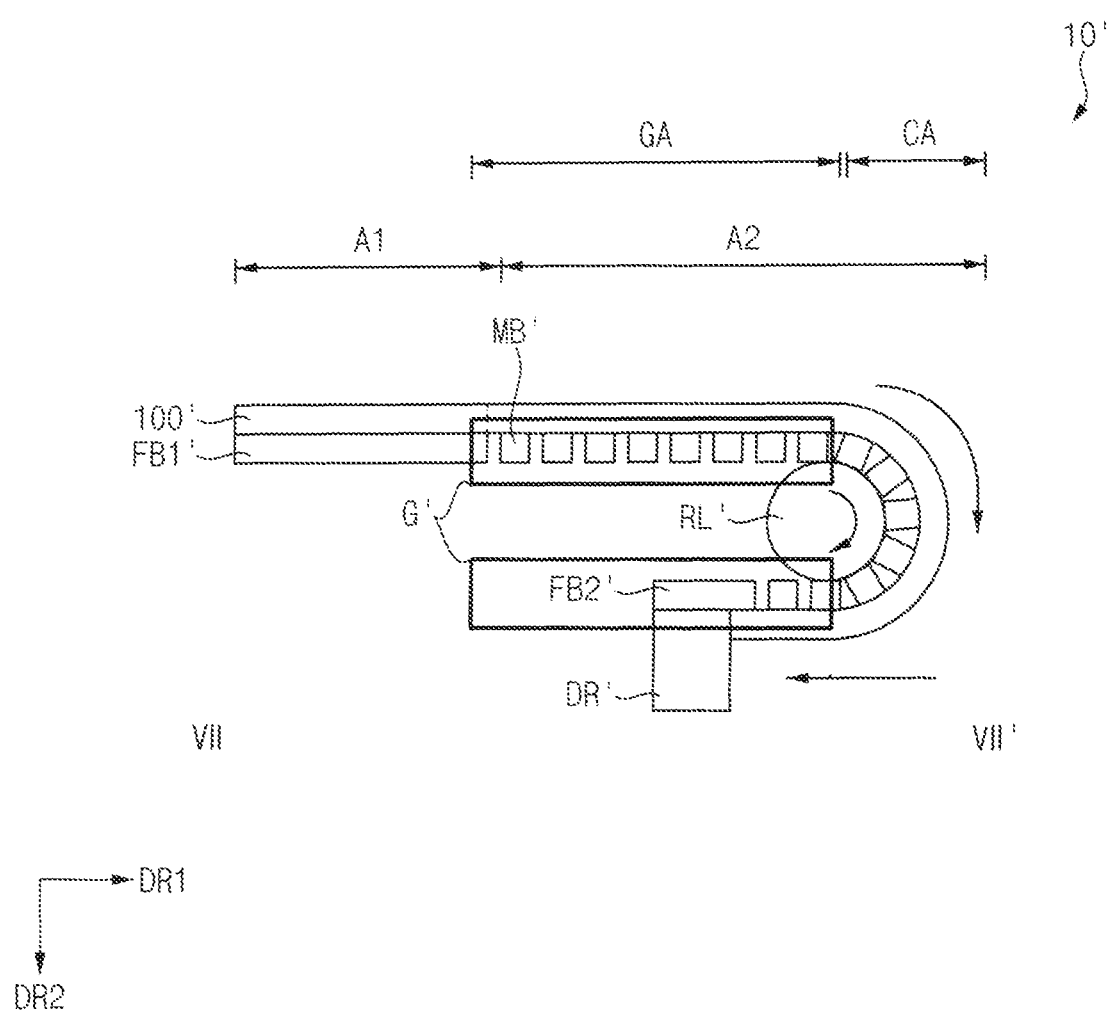

FIG. 15 and FIG. 16 are cross-sectional views taken along a line VII-VII' of FIG. 13. FIG. 15 is a cross-sectional view illustrating a state which the second area A2 is accommodated in the display device 10, and FIG. 16 is a cross-sectional view illustrating a state which the second area A2 is exposed to outside.

Referring to FIG. 15 and FIG. 16, the display device 10' may include a roller RL' disposed in the display device 10'. The roller RL' may be substantially same as the roller RL described with reference to FIG. 3 and FIG. 4.

In an area adjacent to the roller RL', a portion of the display device 10' may be curved to have a predetermined curvature. In this case, the area adjacent to the roller RL' may be referred to as a curved area CA. In the curved area CA, a portion of the display module 100' may be curved to have a substantially constant curvature.

Other portion of the display module 100' except for the portion of the display module 100' may have a substantially flat surface. In this case, the display device 10' may include a guide unit G' accommodating the first supporting plate FB1', a second supporting plate FB2', and a plurality of supporting elements MB' overlapping the other portion of the display module 100'. The guide unit G' may have a receiving groove accommodating first supporting plate FB1', a second supporting plate FB2', and a plurality of supporting elements MB'. Due to the guide unit G', other portion of the display device 10' including the other portion of the display module 100' may have a substantially flat surface. In this case, an area in which the guide unit G' is disposed may be referred to as a guide area GA.

In an embodiment, the guide unit G' may be disposed to be spaced apart from the portion of the display module 100' which is curved to have the curvature. In other words, the curved area CA and the guide area GA may be spaced apart from each other. Accordingly, when the roller RL' rotates clockwise or counterclockwise and the first supporting plate FB1', the second supporting plate FB2', and the plurality of supporting elements MB' are accommodated in the guide unit G', entanglement (or collision) between the first supporting plate FB1', the second supporting plate FB2', and the plurality of supporting elements MB' and the guide unit G' may not occur.

An end of the display module 100' spaced apart from the first area A1 may be electrically connected to a driving part DR'. The driving part DR' may provide a driving signal to the plurality of pixels included in the display panel PNL'.

The second supporting plate FB2' may be disposed at a same layer as the first supporting plate FB1' and the plurality of supporting elements MB'. The second supporting plate FB2' may support the driving part DR'. In an embodiment, the second supporting plate FB2' may be omitted.

Figure 17:
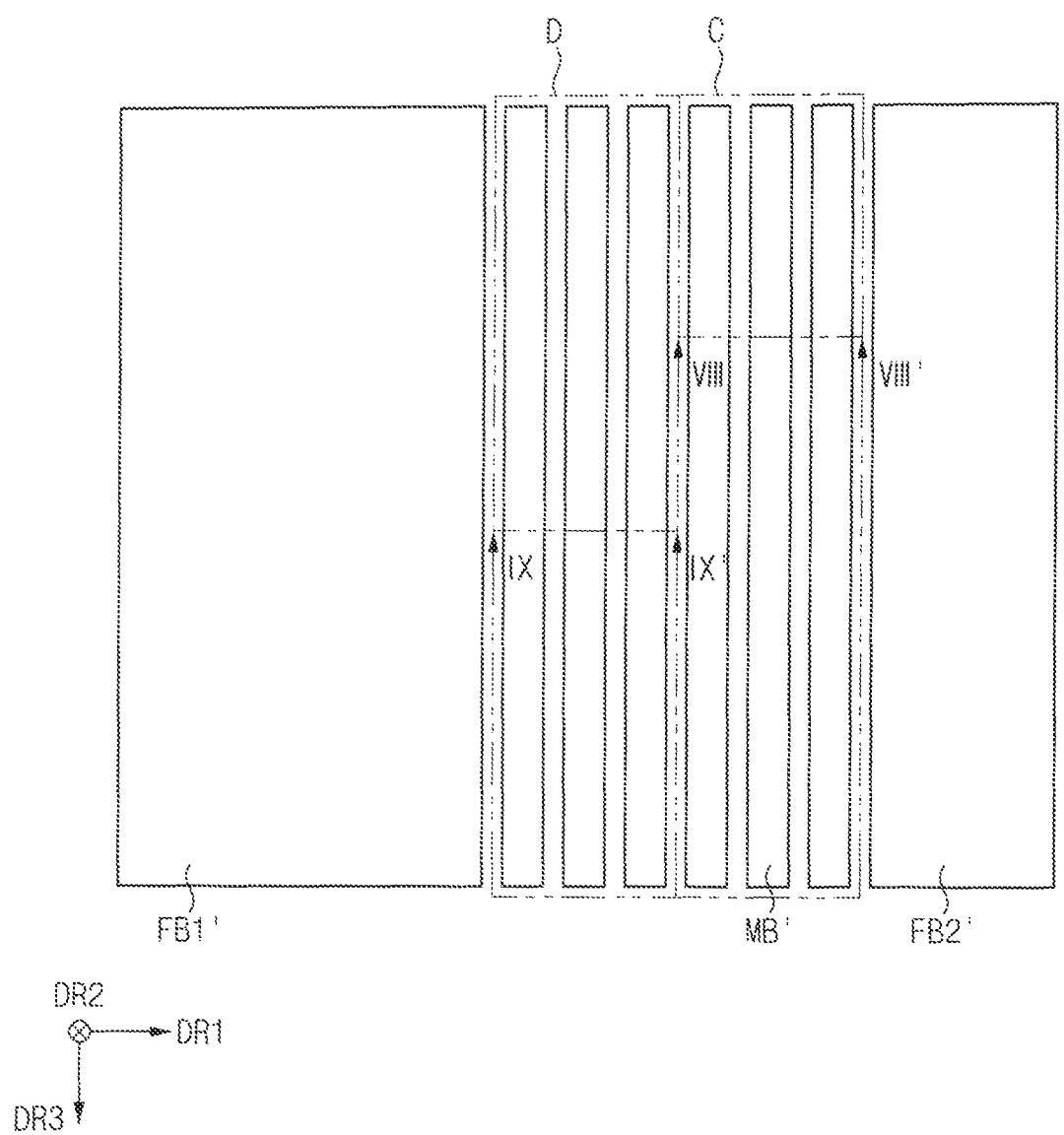
FIG. 17 is a plan view illustrating a plurality of supporting elements included in the display device of FIG. 13.

FIG. 17 is a plan view illustrating a plurality of supporting elements included in the display device of FIG. 13.

Referring to FIG. 17, the plurality of supporting elements MB' may be disposed in a separation area C and an adjacent area D. The separation area C may be an area overlapping the separation portion of the second protective layer PPF2', and the adjacent area D may be an area overlapping the adjacent portion of the second protective layer PPF2'.

Figure 18:
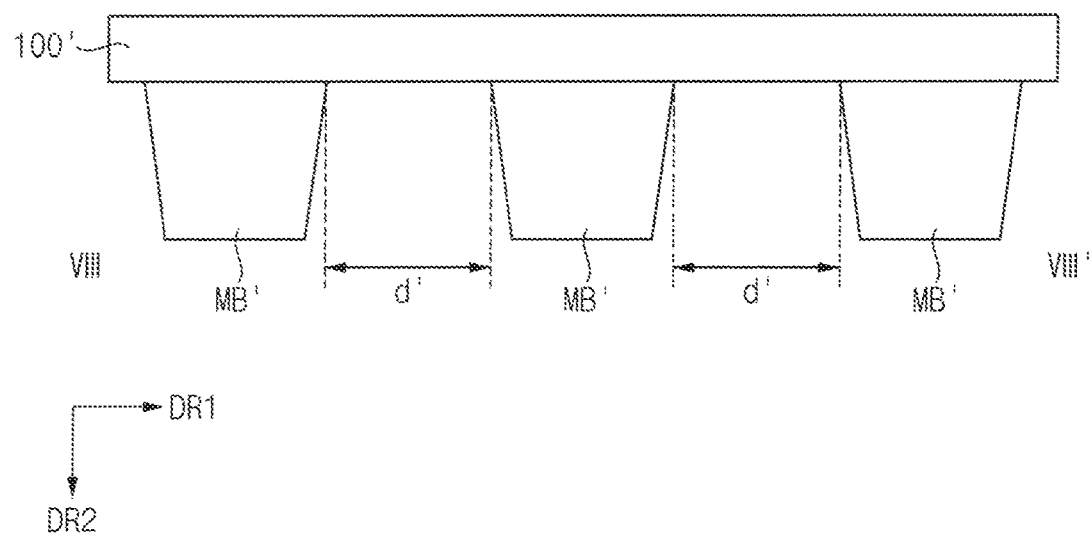
FIG. 18 is a cross-sectional view taken along a line VIII-VIII' of FIG. 17.
Figure 19:
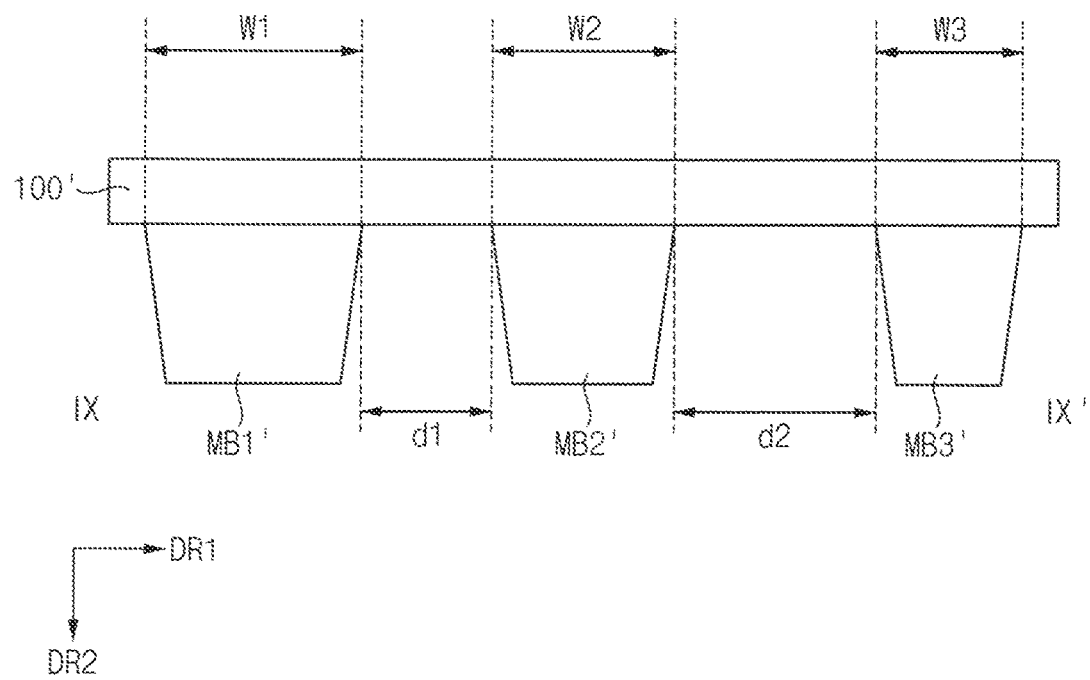
FIG. 19 is a cross-sectional view taken along a line IX-IX' of FIG. 17.

FIG. 18 is a cross-sectional view taken along a line VIII-VIII' of FIG. 17. FIG. 19 is a cross-sectional view taken along a line IX-IX' of FIG. 17.

Referring to FIG. 18, a separation distance between the two supporting elements spaced apart from each other among the plurality of supporting elements MB' disposed under the separation portion of the second protective layer PPF2' may be a first separation distance d'.

The plurality of supporting elements MB' disposed under the separation portion of the second protective layer PPF2' may directly contact the second protective layer PPF2', and in this case, a contact area of the second protective layer PPF2' and each of the supporting elements MB' may be a first contact area.

Referring to FIG. 19, a first supporting element MB1', a second supporting element MB2', and a third supporting element MB3' may be disposed under the adjacent portion of the second protective layer PPF2'. The first to third supporting elements MB1', MB2' and MB3' may be three supporting elements closest to the first protective layer PPF1' among the plurality of supporting elements MB'. For example, the first supporting element MB1' may be a supporting element closest to the first protective layer PPF1', the second supporting element MB2' may be a supporting element closest to the first supporting element MB1', and the third supporting element MB3' may be a supporting element closest to the second supporting element MB2'.

In an embodiment, each of a separation distance d1 between the first supporting element MB1' and the second supporting element MB2' and a separation distance d2 between the second supporting element MB2' and the third supporting element MB3' may be smaller than the first separation distance d'. Accordingly, when the display device 10' slides, lifting may not occur at a boundary between the first area A1 and the second area A2.

In an embodiment, as a distance from the first protective layer PPF1' increases, a separation distance between two supporting elements spaced apart from each other among the supporting elements MB1', MB2', and MB3' disposed under the adjacent portion of the second protective layer PPF2' may gradually increase, and may converge to the first separation distance d'. For example, the separation distance d2 between the second supporting element MB2' and the third supporting element MB3' may be larger than the separation distance d1 between the first supporting element MB1' and the second supporting element MB2'.

In an embodiment, each of a contact area of the first supporting element MB1' with the second protective layer PPF2', a contact area of the second supporting element MB2' with the second protective layer PPF2', and a contact area of the third supporting element MB3' with the second protective layer PPF2' may be larger than the first contact area. For example, in FIG. 18, a contact area of each of the plurality of supporting elements MB' disposed under the separation portion of the second protective layer PPF2' with the second protective layer PPF2' may be proportional to a width of each of the plurality of supporting elements MB' disposed under the second protective layer PPF2'. In this case, the width of each of the plurality of supporting elements MB' disposed under the separation portion of the second protective layer PPF2' may be a first width, and each of a width W1 of the first supporting element MB1', a width W2 of the second supporting element MB2', and a width W3 of the third supporting element MB3' may be larger than the first width. Accordingly, when the display device 10' slides, lifting may not occur at a boundary between the first area A1 and the second area A2.

In an embodiment, as a distance from the first protective layer PPF1' increases, contact areas of the plurality of supporting elements MB1', MB2', and MB3' may gradually decrease, and may converge to the first contact area. For example, the width W1 of the first supporting element MB1' may be larger than the width W2 of the second supporting element MB2', and the width W2 of the second supporting element MB2' may be larger than the width W3 of the third supporting element MB3'.

In FIG. 19, only three supporting elements MB1', MB2', and MB3' are illustrated for convenience of description, but the present invention is not limited thereto. For example, four supporting elements may be disposed under the adjacent portion of the second protective layer PPF2'.

Figure 20:
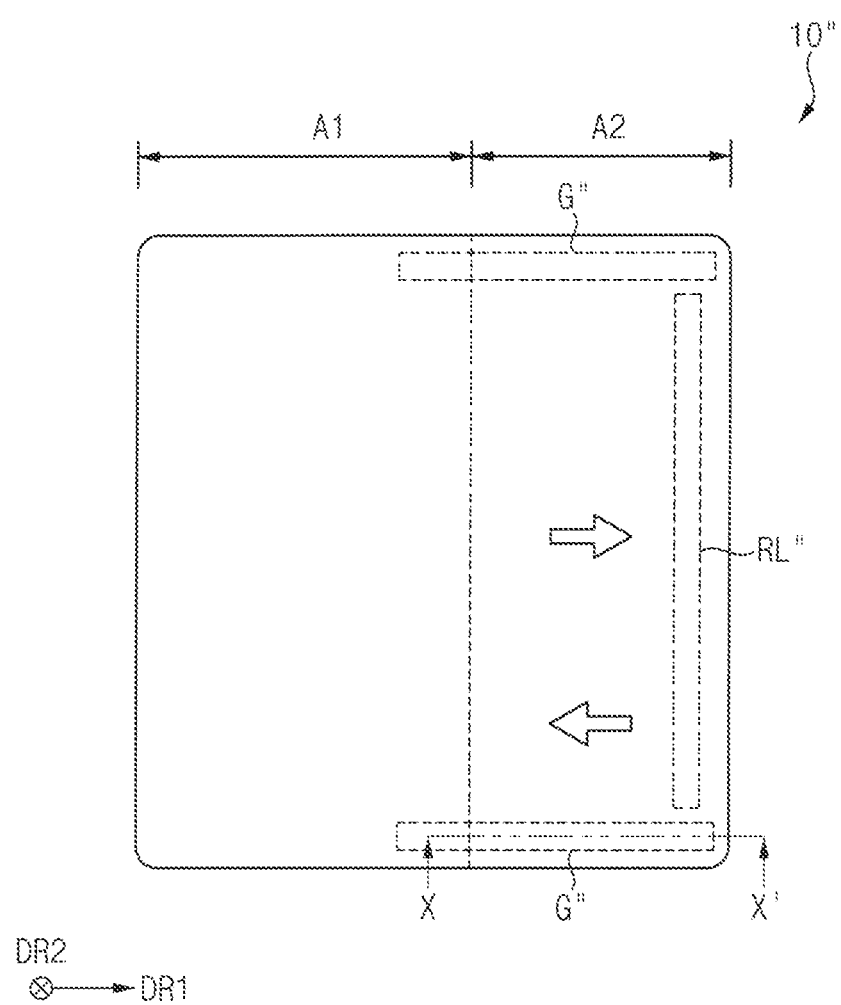
FIG. 20 is a plan view illustrating a display device according to still another embodiment.

FIG. 20 is a plan view illustrating a display device according to still another embodiment.

Referring to FIG. 20, a display device 10" may be substantially similar to the display device 10 described with reference to FIG. 1. Specifically, the display device 10" may be substantially same as the display device 10 except for a guide unit G" and a roller RL". Therefore, hereinafter, descriptions of the overlapping contents will be omitted.

Figure 21:
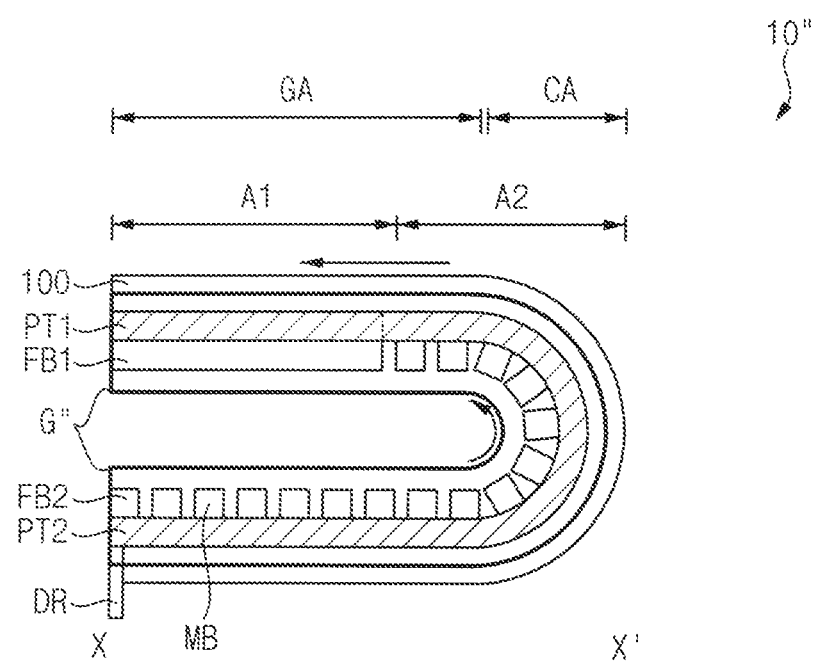
FIG. 21 and FIG. 22 are cross-sectional views taken along a line X-X' of FIG. 20.
Figure 21:
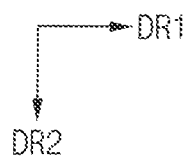
Figure 22:
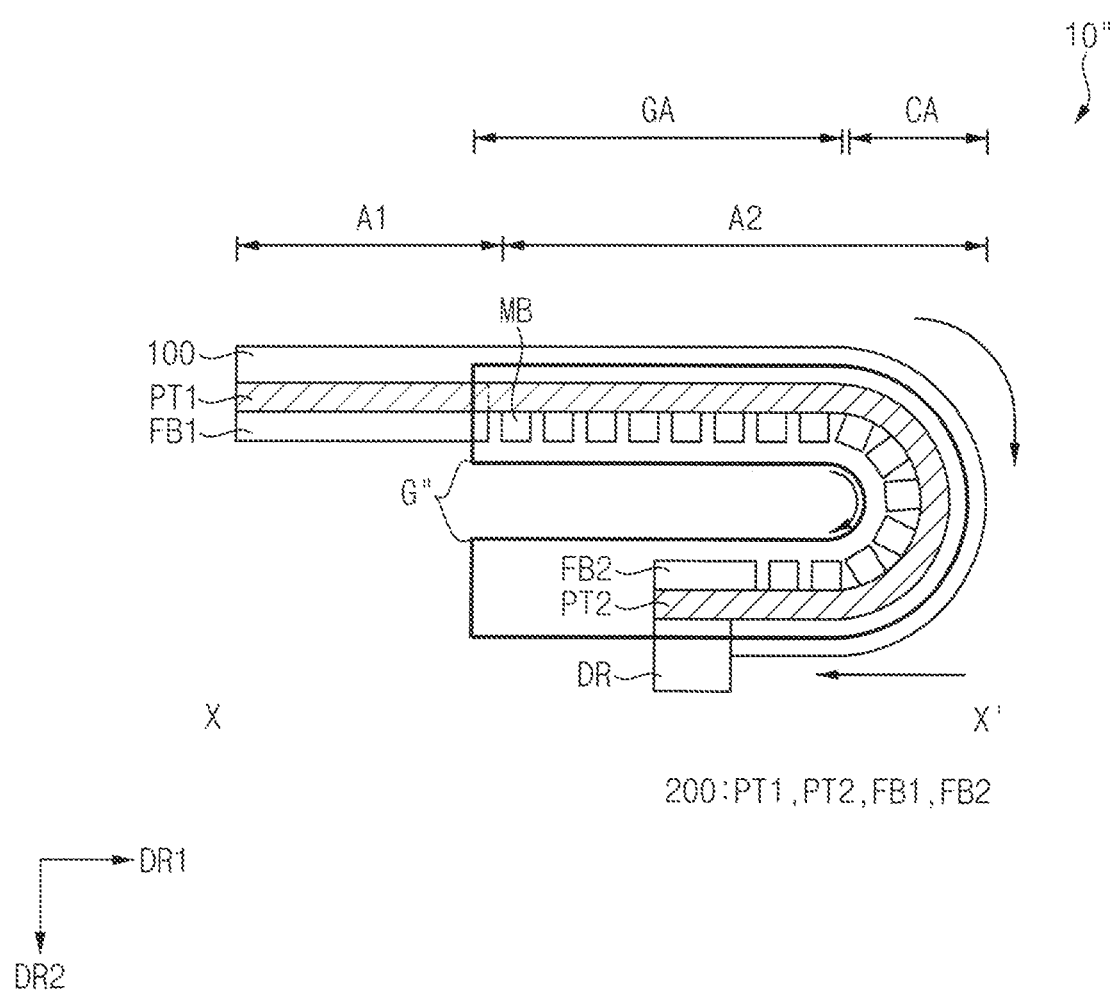
Figure 23:
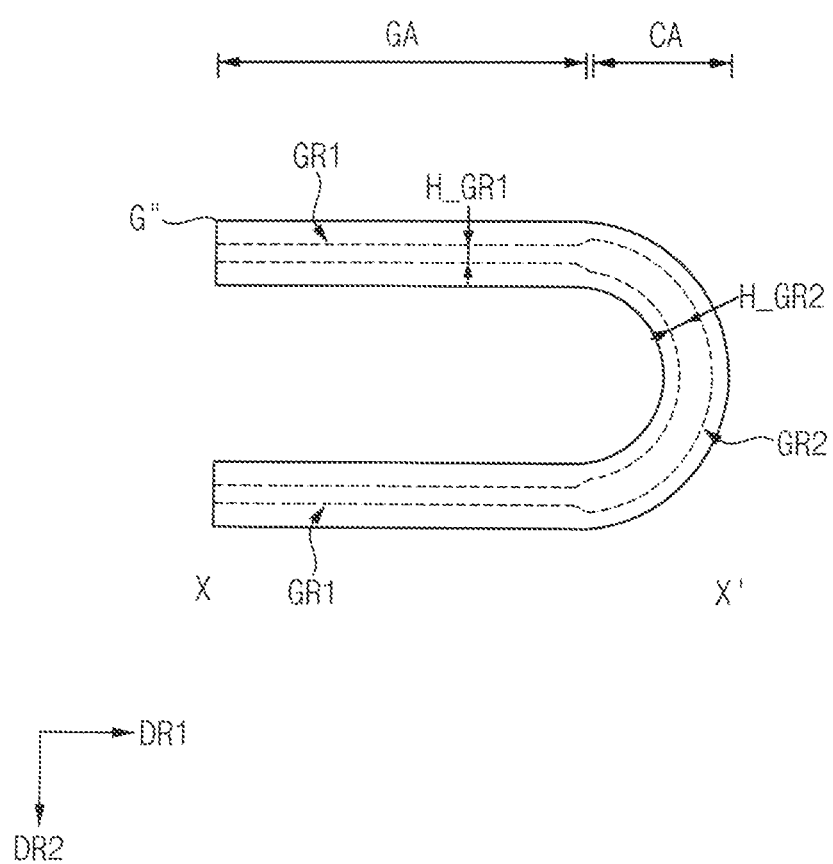
FIG. 23 is a diagram illustrating a guide unit included in the display device of FIG. 20.

FIG. 21 and FIG. 22 are cross-sectional views taken along a line X-X' of FIG. 20. FIG. 21 is a cross-sectional view illustrating a state which a second area A2 is accommodated in the display device 10", and FIG. 22 is a cross-sectional view illustrating a state which the second area A2 is exposed to outside. FIG. 23 is a diagram illustrating a guide unit included in the display device of FIG. 20.

Referring to FIG. 20, FIG. 21, FIG. 22, and FIG. 23, compared to the guide unit G described with reference to FIG. 3 and FIG. 4, the guide unit G" may extend from the guide area GA to the curved area CA. In this case, since the guide unit G" is formed up to the curved area CA, as shown in FIG. 20, A width of the roller RL' in a direction perpendicular to each of the first direction DR1 and the second direction DR2 may be relatively small. That is, the roller RL" may be positioned so as not to overlap the guide unit G" in a plan view.

In the guide area GA, the guide unit G" may have a first receiving groove GR1 accommodating the lower structure 200. In addition, in the guide area GA, the guide unit G‴ may have a second receiving groove GR2 accommodating the lower structure 200.

In an embodiment, a height H_GR1 of the first receiving groove GR1 may be smaller than a height H_GR2 of the second receiving groove GR2. The height H_GR1 of the first receiving groove GR1 may be an height of the first receiving groove GR1 in the second direction DR2. In this case, the height H_GR1 of the first receiving groove GR1 may be substantially same as a height of the lower structure 200 accommodated in the first receiving groove GR1.

In this case, in order to prevent entanglement (or collision) between the lower structure 200 accommodated in the second receiving groove GR2 and the guide unit G″, the height H_GR2 of the second receiving groove GR2 may be larger than the height H_GR1 of the first receiving groove GR1. For example, the height H_GR2 of the second receiving groove GR2 may be larger than or equal to about 1.1 times and less than or equal to about 1.3 times of the height H_GR1 of the first receiving groove GR1.

In an embodiment, when the guide area GA and the curved area CA are spaced apart, in an area between the guide area GA and the curved area CA, a height of a receiving groove formed in the guide unit G″ may be gradually changed. For example, in the area between the guide area GA and the curved area CA, the width of the receiving groove formed in the guide unit G″ may be gradually increased from the width H_GR1 of the first receiving groove GR1 toward the with H_GR2 of the second receiving groove GR2 from the guide area GA to the curved area CA.

In an embodiment, the guide unit G″ and the roller RL″ may also be applied to the display device 10′ described with reference to FIG. 15, FIG. 16, FIG. 17, FIG. 18, and FIG. 19. For example, the display device 10′ may include the guide unit G″ and the roller RL″ instead of the guide unit G′ and the roller RL′.

Figure 24:
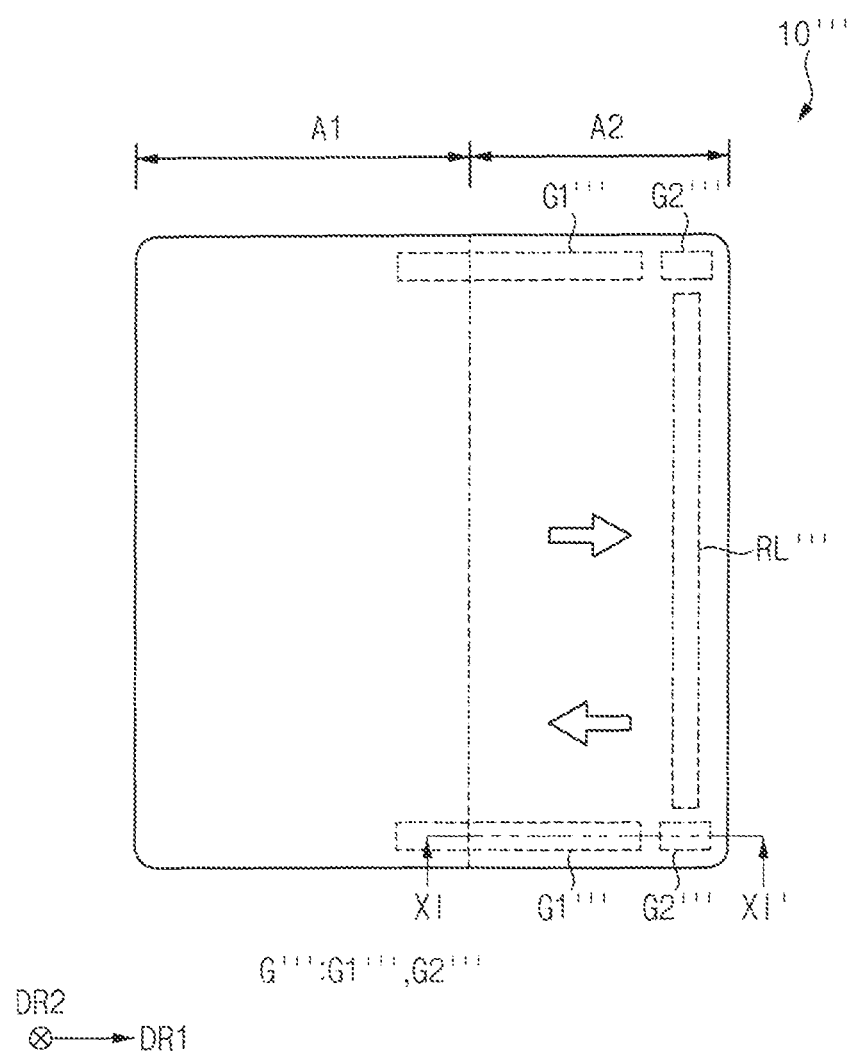
FIG. 24 is a plan view illustrating a display device according to further still another embodiment.

FIG. 24 is a plan view illustrating a display device according to further still another embodiment.

Referring to FIG. 24, a display device 10‴ may be substantially similar to the display device 10 described with reference to FIG. 1. Specifically, the display device 10″ may be substantially same as the display device 10 except for a guide unit G‴ and a roller RL‴. Therefore, hereinafter, descriptions of the overlapping contents will be omitted.

Figure 25:
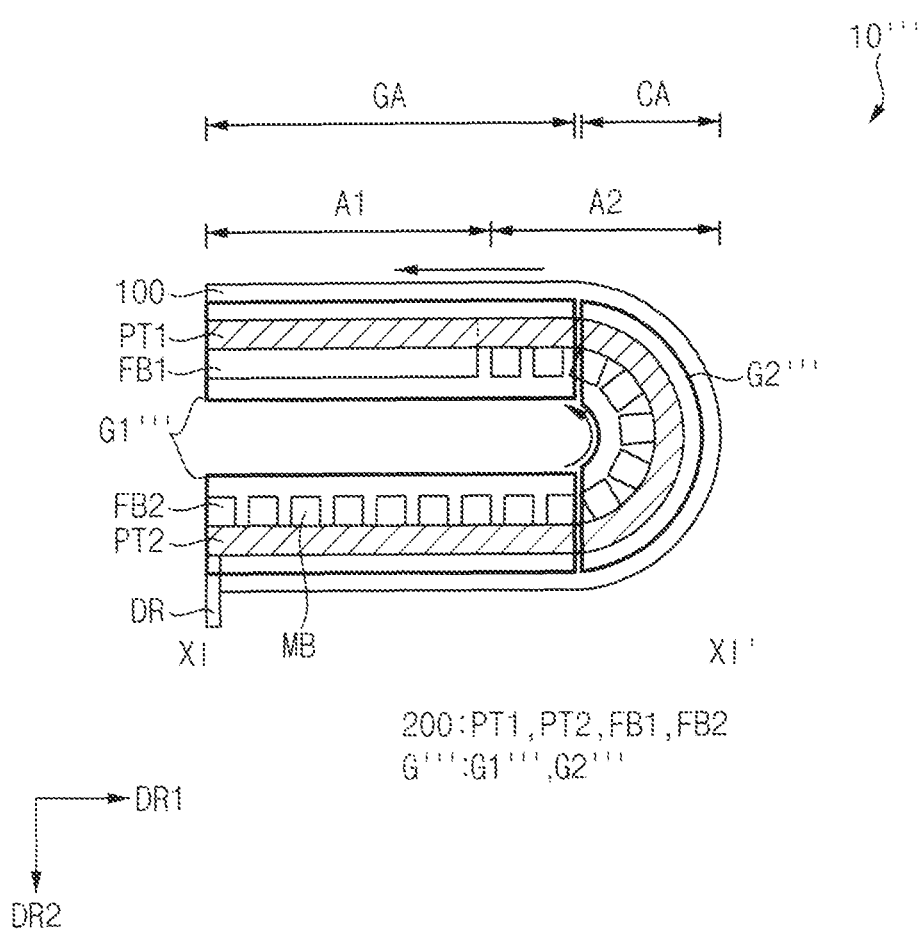
FIG. 25 and FIG. 26 are cross-sectional views taken along a line XI-XI' of FIG. 24.
Figure 26:
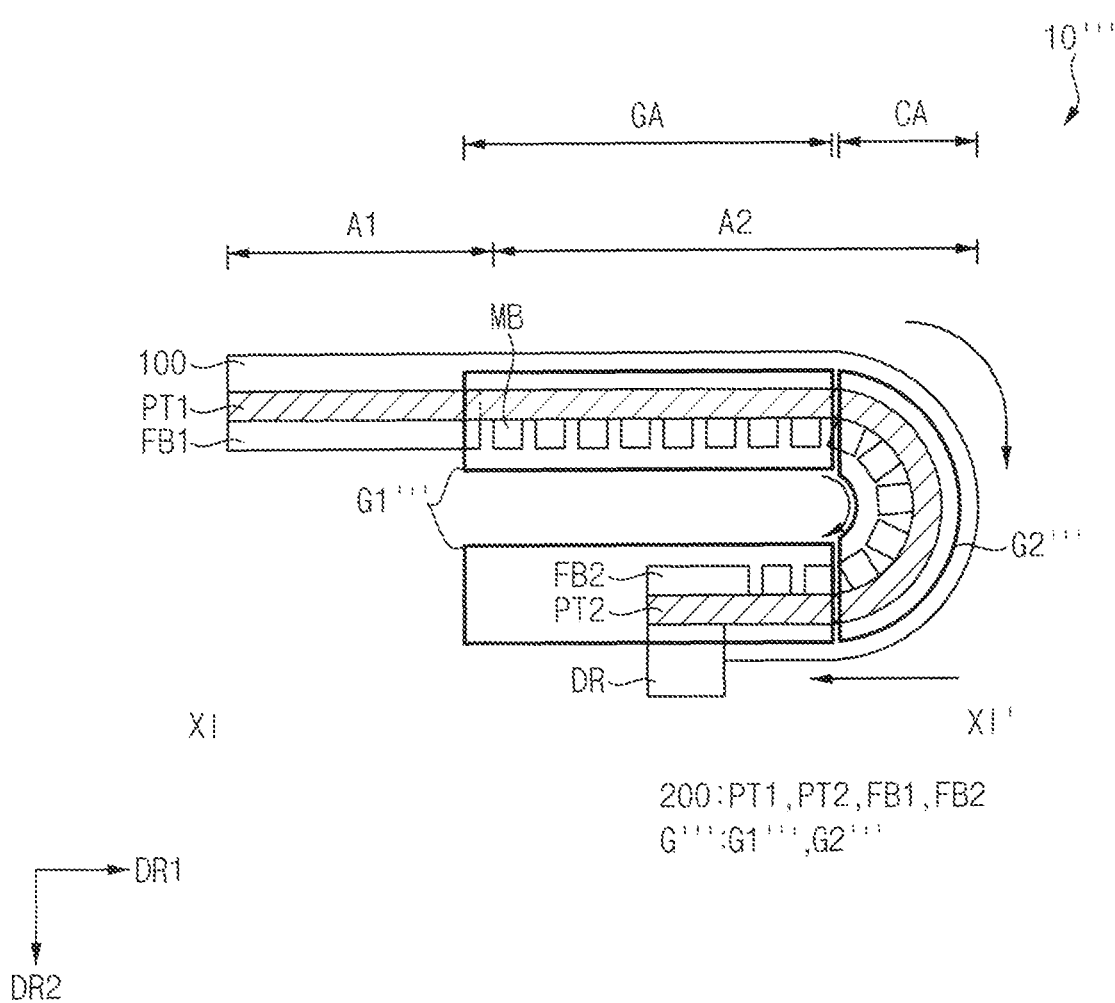
Figure 27:
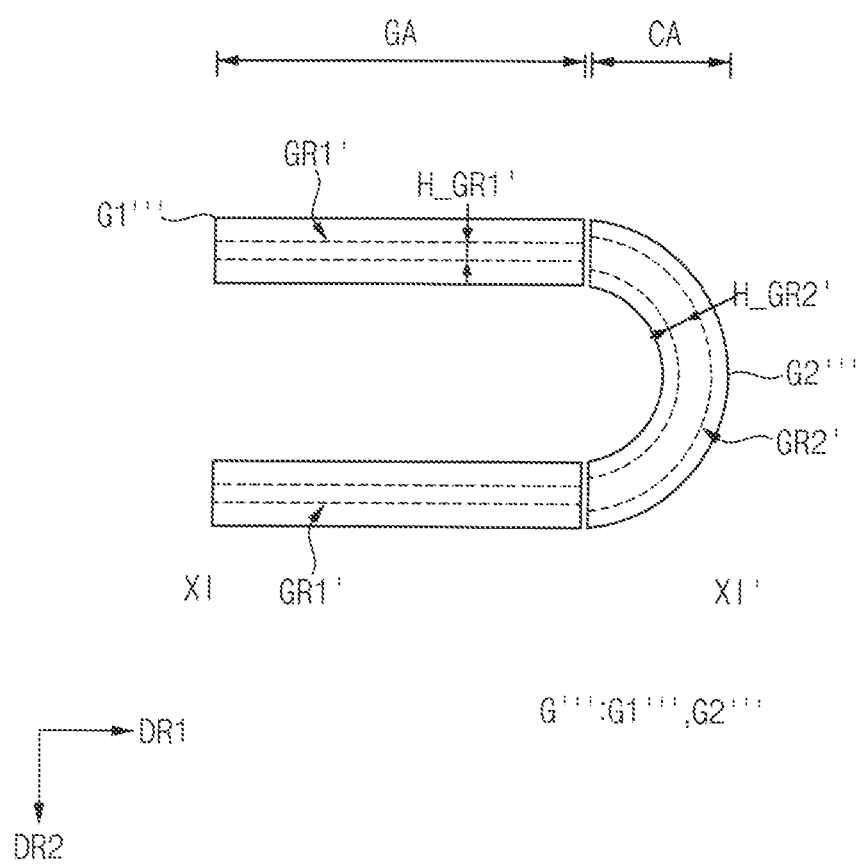
FIG. 27 is a diagram illustrating a guide unit included in the display device of FIG. 24.

FIG. 25 and FIG. 26 are cross-sectional views taken along a line XI-XI′ of FIG. 24. FIG. 25 is a cross-sectional view illustrating a state which a second area A2 is accommodated in the display device 10″, and FIG. 26 is a cross-sectional view illustrating a state which the second area A2 is exposed to outside. FIG. 27 is a diagram illustrating a guide unit included in the display device of FIG. 24. Referring to FIG. 24, FIG. 25, FIG. 26, and FIG. 27, the guide unit G‴ may include a first guide unit G1‴ and the second guide unit G2‴. The first guide unit G1‴ may be formed in the guide area GA, and the first guide unit G1‴ may be substantially same as the guide unit G described with reference to FIG. 3 and FIG. 4. The second guide unit G2‴ may be formed in the curved area CA, and the second guide unit G2‴ may be spaced apart from the first guide unit G1‴.

The roller RL‴ may be substantially same as the roller RL″ described with reference to FIG. 20, FIG. 21, FIG. 22, and FIG. 23.

In the guide area GA, the first guide unit G1‴ may have a first receiving groove GR1′ accommodating the lower structure 200. In the curved area CA, the second guide unit G2‴ may have a second receiving groove GR2′ accommodating the lower structure 200.

In an embodiment, a height H_GR1′ of the first receiving groove GR1′ may be smaller than a height H_GR2′ of the second receiving groove GR2′. The height H_GR1′ of the first receiving groove GR1′ may be a height of the first receiving groove GR1′ in the second direction DR2. In this case, the height H_GR1′ of the first receiving groove GR1′ may be substantially same as a height of the lower structure 200 accommodated in the first receiving groove GR1′ in the second direction DR2.

In this case, in order to prevent entanglement (or collision) between the lower structure 200 accommodated in the second receiving groove GR2′ and the guide unit G‴, the height H_GR2′ of the second receiving groove GR2′ may be larger than the height H_GR1′ of the first receiving groove GR1′. For example, the height H_GR2′ of the second receiving groove GR2′ may be larger than or equal to about 1.1 times and less than or equal to about 1.3 times of the height H_GR1′ of the first receiving groove GR1′.

In an embodiment, the guide unit G″ and the roller RL‴ may also be applied to the display device 10′ described with reference to FIG. 15, FIG. 16, FIG. 17, FIG. 18, and FIG. 19. For example, the display device 10′ may include the guide unit G‴ and the roller RL‴ instead of the guide unit G′ and the roller RL′.

Although certain embodiments and implementations have been described herein, other embodiments and modifications will be apparent from this description. Accordingly, the invention is not limited to such embodiments, but rather various obvious modifications and equivalent arrangements would be apparent to a person of ordinary skill in the art.

What is claimed is:

1. A display device comprising:
    a display module comprising a first area and a second area extending from at least one side of the first area, wherein a portion of the display module is curved in the second area to have a constant curvature;
    a first plate disposed under the display module in the first area;
    a second plate disposed under the display module in the second area, extending from the first plate, and comprising a plurality of pattern portions defining an opening pattern having an edge of a closed curve and a plurality of segment portions disposed between the plurality of pattern portions, wherein a portion of the second plate overlapping the portion of the display module is curved to have a constant curvature; and
    a plurality of supporting elements disposed under the plurality of segment portions.

2. The display device of claim 1, wherein the opening pattern is spaced apart from an outer edge of the second plate.

3. The display device of claim 1, wherein the second plate comprises an adjacent portion adjacent to the first plate, and a separation portion spaced apart from the first plate and adjacent to the adjacent portion, and
    each of supporting elements disposed under the separation portion among the plurality of supporting elements is in contact with each of the plurality of segment portions of the second plate by a first contact area.

4. The display device of claim 3, wherein a contact area of each of supporting elements disposed under the adjacent portion among the plurality of supporting elements with each of the plurality of segment portions of the second plate is larger than first contact area.

5. The display device of claim 4, wherein, as a distance from the first plate increases, the contact area of each of supporting elements disposed under the adjacent portion with each of the plurality of segment portions of the second plate gradually decreases.

6. The display device of claim 1, wherein the second plate comprises an adjacent portion adjacent to the first plate, and a separation portion spaced apart from the first plate and adjacent to the adjacent portion, and
- a distance between two supporting elements spaced apart from each other among the plurality of supporting elements disposed under the separation portion is a first separation distance.

7. The display device of claim 6, wherein a distance between two supporting elements spaced apart from each other among the plurality of supporting elements disposed under the adjacent portion is smaller than the first separation distance.

8. The display device of claim 7, wherein, as a distance from the first plate increases, the distance between two supporting elements spaced apart from each other among the plurality of supporting elements disposed under the adjacent portion gradually increases.

9. The display device of claim 1, wherein a lower surface of the display module directly contacts each of an upper surface of the first plate and an upper surface of the second plate.

10. The display device of claim 9, wherein an area of the lower surface of the display module is smaller than sum of an area of the upper surface of the first plate and an area of the upper surface of the second plate.

11. The display device of claim 1, further comprising:
- a supporting plate disposed under the first plate.

12. The display device of claim 1, further comprising:
- a driving part electrically connected to the display module in the second area.

13. The display device of claim 1, wherein other portion of the display module except the portion of the display module has a flat surface.

14. The display device of claim 13, further comprising:
- a guide unit defining a receiving groove accommodating the first plate, the second plate, and the plurality of supporting elements overlapping the other portion of the display module.

* * * * *